(12) United States Patent
Kokubo et al.

(10) Patent No.: US 6,797,550 B2
(45) Date of Patent: Sep. 28, 2004

(54) SEMICONDUCTOR DEVICE AND MANUFACTURING METHOD THEREFOR

(75) Inventors: Chiho Kokubo, Kanagawa (JP); Aiko Shiga, Kanagawa (JP); Yoshifumi Tanada, Kanagawa (JP); Shunpei Yamazaki, Tokyo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 10/321,839

(22) Filed: Dec. 18, 2002

(65) Prior Publication Data

US 2003/0224550 A1 Dec. 4, 2003

(30) Foreign Application Priority Data

Dec. 21, 2001 (JP) ........................................ 2001-390714

(51) Int. Cl.[7] .............................................. H01L 21/84
(52) U.S. Cl. ...................... 438/164; 438/166; 438/482; 438/487
(58) Field of Search ............................. 438/149, 164, 438/166, 482, 486, 487

(56) References Cited

U.S. PATENT DOCUMENTS

| 4,177,372 A | 12/1979 | Kotera et al. |
| 4,316,074 A | 2/1982 | Daly |
| 4,330,363 A | 5/1982 | Biegesen et al. |
| 4,406,709 A | 9/1983 | Celler et al. |
| 4,592,799 A | 6/1986 | Hayafuji |

(List continued on next page.)

FOREIGN PATENT DOCUMENTS

| EP | 0 488 801 B1 | 6/1992 |
| JP | 59-165450 | 9/1984 |
| JP | 59-205761 | 11/1984 |
| JP | 60-245172 | 12/1985 |
| JP | 60-245173 | 12/1985 |

(List continued on next page.)

OTHER PUBLICATIONS

Kakkad et al. Journal of *Non–Crystalline Solids vol. 115/PP. 66–68* (1989) *"Low Temperature Selective Crystallization of Amorphous Silicon".*

Liu et al. Appl. Phys. Lett. vol. 55/No. 7/PP.660–662 (Aug. 1989) *"Selective area crystallization of amorphous silicon films by low–temperature rapid thermal annealing".*

Lin et al. IEEE Electron Device Letters vol. 15/No. 4/PP. 138–139 (Apr. 1984) *"The Impact of Scaling–Down Oxide Thickness on Poly–Si Thin–Film Transistors' I–V Characteristics"*(Lin et al.).

Li et al. IEEE Device Letters vol. 14/No. 5/pp.240–242 (May 1993) *"On the Pseudo–Subthreshold Characteristics of Polycrystalline–Silicon Thin–Fiml Transistors with Large Grain Size".*

(List continued on next page.)

*Primary Examiner*—T. N. Quach
(74) *Attorney, Agent, or Firm*—Nixon Peabody LLP; Jeffrey L. Costellia

(57) ABSTRACT

To provide a method of efficiently configuring a circuit requiring high inter-device consistency by using thin-film transistors. A semiconductor layer is formed on a substrate and is patterned into desired shapes to form first semiconductor islands. The first semiconductor islands are uniformly crystallized by laser irradiation within the surface areas thereof. Thereafter, the semiconductor layers are patterned into desired shapes to become active layers of the thin-film transistors layer. Active layers of all of thin-film transistors constituting one unitary circuit are formed of one of the first semiconductor islands in this case. Thus, the TFTs mutually realize high consistency.

14 Claims, 21 Drawing Sheets

U.S. PATENT DOCUMENTS

| | | | |
|---|---|---|---|
| 5,147,826 A | 9/1992 | Liu et al. | |
| 5,246,870 A | 9/1993 | Merchant | |
| 5,275,851 A | 1/1994 | Fonash et al. | |
| 5,294,555 A | 3/1994 | Mano et al. | |
| 5,306,584 A | 4/1994 | Palmer | |
| 5,315,101 A | 5/1994 | Hughes et al. | |
| 5,367,392 A | 11/1994 | Janai | |
| 5,403,772 A | 4/1995 | Zhang et al. | |
| 5,466,958 A | 11/1995 | Kakumu | |
| 5,488,000 A | 1/1996 | Zhang et al. | |
| 5,488,005 A | 1/1996 | Han et al. | |
| 5,521,107 A | 5/1996 | Yamazaki et al. | |
| 5,528,056 A | 6/1996 | Shimada et al. | |
| 5,529,937 A | 6/1996 | Zhang et al. | |
| 5,543,636 A | 8/1996 | Yamazaki | |
| 5,563,427 A | 10/1996 | Yudasaka et al. | |
| 5,569,610 A | 10/1996 | Zhang et al. | |
| 5,591,668 A | 1/1997 | Maegawa et al. | |
| 5,592,318 A | 1/1997 | Majima et al. | |
| 5,604,360 A | 2/1997 | Zhang et al. | |
| 5,608,232 A | 3/1997 | Yamazaki et al. | |
| 5,618,741 A | 4/1997 | Young et al. | |
| 5,620,906 A | 4/1997 | Yamaguchi et al. | |
| 5,625,473 A | 4/1997 | Kondo et al. | |
| 5,656,825 A | 8/1997 | Kusumoto et al. | |
| 5,679,588 A | 10/1997 | Choi et al. | |
| 5,696,003 A | 12/1997 | Makita et al. | |
| 5,698,882 A | 12/1997 | Park | |
| 5,712,191 A | 1/1998 | Nakajima et al. | |
| 5,736,751 A | 4/1998 | Mano et al. | |
| 5,821,137 A | 10/1998 | Wakai et al. | |
| 5,824,574 A * | 10/1998 | Yamazaki et al. | 438/150 |
| 5,886,366 A | 3/1999 | Yamazaki et al. | |
| 5,891,764 A | 4/1999 | Ishihara et al. | |
| 5,937,282 A | 8/1999 | Nakajima et al. | |
| 5,940,690 A | 8/1999 | Kusumoto et al. | |
| 6,149,988 A | 11/2000 | Shinohara et al. | |
| 6,169,292 B1 | 1/2001 | Yamazaki et al. | |
| 6,204,099 B1 | 3/2001 | Kusumoto et al. | |
| 6,221,701 B1 | 4/2001 | Yamazaki | |
| 6,256,849 B1 | 7/2001 | Kim | |
| 6,337,232 B1 | 1/2002 | Kusumoto et al. | |
| 6,455,401 B1 * | 9/2002 | Zhang et al. | 438/486 |
| 6,555,875 B2 * | 4/2003 | Kawasaki et al. | 257/347 |
| 6,570,184 B2 * | 5/2003 | Horikoshi et al. | 257/72 |
| 2003/0228723 A1 * | 12/2003 | Yamazaki et al. | 438/164 |

FOREIGN PATENT DOCUMENTS

| | | |
|---|---|---|
| JP | 60-245174 | 12/1985 |
| JP | 61-048976 | 3/1986 |
| JP | 61-071636 | 4/1986 |
| JP | 61-085868 | 5/1986 |
| JP | 61-251115 | 11/1986 |
| JP | 63-142807 | 6/1988 |
| JP | 01-134345 | 5/1989 |
| JP | 01-154124 | 6/1989 |
| JP | 01-194351 | 8/1989 |
| JP | 02-140915 | 5/1990 |
| JP | 04-170067 | 6/1992 |
| JP | 04-206970 | 7/1992 |
| JP | 04-282869 | 10/1992 |
| JP | 04-313272 | 11/1992 |
| JP | 05-067785 | 3/1993 |
| JP | 05-090589 | 4/1993 |
| JP | 05-206464 | 8/1993 |
| JP | 11-354463 | 12/1993 |
| JP | 07-130652 | 5/1995 |
| JP | 08-078329 | 3/1996 |
| JP | 09-270393 | 10/1997 |
| JP | 10-135468 | 5/1998 |
| JP | 10-135469 | 5/1998 |

OTHER PUBLICATIONS

Li et al. IEEE Device Letters vol. 14/No. 5/pp.240–242 (May 1993) "On the Pseudo–Subthreshold Characteristics of Polycrystalline–Silicon Thin–Fiml Transistors with Large Grain Size".

Lee et al. IEEE Electron Device Letters vol. 15/No.8/pp. 301–303 (Aug. 1994) "High Performance Low Temperature Polysilicon Thin Film Transistor Using ECR Plasma Thermal Oxide as Gate Insulator" (Lee et al.).

Lee et al. IEDM 94 pp. 523–526 (1994) "ECR Plasma Oxidation Effects on Performance and Stability of Polysilicon Thin Film Transistors".

Dvureschenskii et al. Phys. Stat. Sol. vol. 95/pp. 635–640 (1986) "Transport Phenomena in Amorphous Silicon Doped by Ion Implantation of 3d Metals".

Hayzelden et al. Appl. Phys. Letter vol. 60/No. 2/pp. 225–227 (Jan. 13, 1992) "In situ transmission electron microscopy studies of silicide–mediated crystallization of amporphous silicon".

Hempel et al. Solid State Communciations vol. 85/No. 11/pp. 921–924 (1993) "Needle–Like Crystallization of Ni Doped Amorphous Silicon Thin Films".

Kakkad et al. J. Appl. Phys. vol. 65/pp. 2069–2072 (Mar. 11, 1989) Crystallized Si film by low–temperature rapid thermal annealing of amorphous silicon.

Liu et al. Appl. Phys. Letters vol. 62/No. 20/pp. 2554–2556 (May 1993) "Polycrystalline silicon thin film transistors on Cornin 7059 glass substrates using short time, low–temperature processing".

Caune et al. Applied Surface Science vol. 36/pp. 597–604 (1989) "Combined CW Laser and Furnace Annealing of Amorphous Si and Ge in Contact with Some Metals".

Hara "High Peformance of poly–Si TFTs on a Glass by a Stable Scanning CW laser Lateral Crystaliization–"IEDM2001.

Takeuchi et al. "Performance of poly–Si TFT using the CW laser lateral crystallizzation (CLC)" IDMC 2002 pp. 73–76.

Takeuchi et al. "Performance of poly–Si TFTs fabricated by a suitable scanning CW laser crystallization" AM–LCD'01 pp. 251–254.

Hara et al. "High–Performance polycrystalline silicon thin film transistor on non–alkali glass produced using continuous wave alser alteral crystallization" Jpn. J. Appl. Phys. vol. 41/pp. L311–L313 (Mar. 15, 2002).

Hara et al. "Ultra–High Performance Poly–Si TFTs on a Glass by a Stable Scanning CW laser Lateral Crystallization" AM–LCE'01 pp.227–230.

* cited by examiner

- ACTIVE LAYER
- FIRST WIRING MATERIAL
- SECOND WIRING MATERIAL
- ○ CONTACT HOLE

——— COTROL SIGNAL
—·—·— DETECTING SINGNAL

SEMICONDUCTOR DEVICE AND MANUFACTURING METHOD THEREFOR

BACKGROUND OF THE INVENTION

1. Field of the Invention

The present invention relates to a manufacturing method for a semiconductor device and a semiconductor device manufactured according to the manufacturing method. The "semiconductor device" in this specification refers to an electrooptical device such as a liquid crystal display device or a light emitting device and an electronic device using them as a display portion.

2. Description of the Related Art

According to techniques widely employed in recent years, an amorphous semiconductor layer formed on an insulator, particularly, a glass substrate is crystallized, crystalline semiconductor layers are thus obtained, and thin-film transistors (which hereinbelow will be referred to as "TFTs") are manufactured using the crystalline semiconductor layers as active layers. In addition, TFT electrical characteristics have rapidly been improved in recent years.

According to the recent technical advancement, signal-processing circuits of various types, which had been externally mounted using ICs or the like, initially, can be manufactured by using TFTs. Consequently, display devices in which a pixel portion and driver circuits therefor are formed integrally on the substrate have been realized. The displays using a reduced number of components are small and lightweight, and enable a significant manufacturing cost reduction to be implemented. As such, research and development in this field are widely advancing.

TFTs presently used are represented by amorphous silicon TFTs (each of which hereinbelow will be referred to as "a-Si TFT") and polysilicon TFTs (each of which hereinbelow will be referred to as "p-Si TFT"). The a-Si TFTs are formed using the aforementioned amorphous semiconductor layer as an active layer, and the p-Si TFTs are formed using the aforementioned crystalline semiconductor layer as an active layer. Compared to the a-Si TFT, the p-Si TFT is superior in various aspects such as significantly high field-effect mobility. Thus, p-Si TFTs have high performance sufficient to form driver circuits of display devices of the type as described above.

However, since transistors used in IC chips or the like are formed on monocrystal silicon, the transistors have even higher electrical characteristics, and the electrical characteristics can be obtained uniformly. In comparison, the p-Si TFT has the semiconductor layer made from an aggregation of numerous crystal grains. While crystalline conditions are sufficient, respectively, electrical characteristics are significantly inferior because of, for example, variation in the orientation boundaries among the crystal grains (grain boundaries). Cases can occur in which a p-Si TFT is formed with an active layer containing a large number of grain boundaries, and variation occurs in the electrical characteristics because of variation in the number of grain boundaries or in the orientation of adjacent crystal grains. In other words, even in a case where TFTs of the same size are manufactured, and voltages of the same magnitude are applied to electrodes, respectively, variation still occurs in, for example, values of currents.

Operational amplifier circuits and differential amplifier circuits are given as representative circuits formed using transistors. These circuits include a current mirror circuit. As shown in FIG. 2A, the current mirror circuit is configured using two transistors 201 and 202, and is characterized in that a drain current $I_1$ flowing through the transistor 201 is identical with a drain current $I_2$ flowing through the transistor 202.

For example, an operational prerequisite condition of the current mirror circuit is that the transistors 201 and 202 are identical in characteristics. Even when the two transistors with variation in characteristics operate, since the condition of $I_1=I_2$ is not always ensured, the transistors do not function as an intended circuit. As such, ordinarily, transistors used to form a current mirror circuit are configured using identical materials in terms of, for example, the channel length and channel width. FIG. 2B is a diagram of an example layout of a practical current mirror circuit formed on a substrate.

FIG. 2C shows the configuration of a differential amplifier circuit using this current mirror circuit as an active load. In the circuit, when different potentials are applied to input terminals ($In_1$ and $In_2$), operation is performed satisfying the condition of $I_1=I_2+I_3$ by utilizing the above current mirror circuit. In the operation, a potential difference between signals input to the input terminals $In_1$ and $In_2$ is amplified, and a waveform generated through the amplification can be obtained from an output terminal (Out) of the circuit. Also in this case, the circuit operates on the prerequisite condition that TFTs 211 to 214 are mutually identical in the electrical characteristics.

In practice, however, as long as the electrical characteristics vary in the p-Si TFT, even when the devices are arranged to have the same sizes, the variation cannot be suppressed. Consequently, the transistors are not suitable for manufacturing the circuit as described above.

Techniques for crystallizing an amorphous semiconductor layer include a technique in which a CW (continuous wave) laser is unidirectionally operated, and laser light is irradiated onto a semiconductor layer. According to this technique, crystal is grown continuously along the operation direction, and monocrystal is thus formed extending long in the operation direction. This technique is considered to enable crystal containing substantially no grain boundaries at least in the direction of the TFT. In this case, the crystal grains have a composition close to that of monocrystal, thereby being imparted with high electrical characteristics and uniformity.

Nevertheless, however, peeling-off can occur with a semiconductor layer deposited on a substrate during the irradiation of CW laser light thereto. When peeling of a semiconductor layer has occurred in a portion of the substrate, removal processing is performed on the semiconductor layer if possible to continue the manufacturing steps such that a semiconductor layer is re-formed. In this case, however, losses are inevitably involved due to the increase in the number of manufacturing steps. Moreover, according to a recent manufacturing method using a large substrate, since a large number of devices can be formed at a time on the substrate, even a loss of a single substrate results in a loss of a plurality of devices.

SUMMARY OF THE INVENTION

The present invention is made in view of the problems described above, and an object thereof is to provide a method for efficiently forming a circuit such as a current mirror circuit that requires high inter-device consistency by using polysilicon thin-film transistors (p-Si TFTs).

According to the present invention, after a semiconductor layer is formed on a substrate, first semiconductor islands are formed by a patterning process. Then, the first semiconductor islands are crystallized or are enhanced in crystallinity according to laser irradiation, and second semiconductor islands are then formed by a patterning process. The second semiconductor island is used at a later step as an active layer of a TFT.

A single or a plurality of second semiconductor islands are formed from the first semiconductor island. Particularly, the present invention is characterized in that a single first semiconductor island is used to form second semiconductor islands that are respectively used as active layers for TFTs for which high consistency is required, specifically for all TFTs constituting, for example, one current mirror circuit, one differential amplifier circuit, or one operational amplifier circuit. Hereinbelow, the terminology "unitary circuit" generally refers to one circuit containing all the TFTs for which particularly high consistency is required among semiconductor circuits or a configuration portion equivalent thereto. However, the unitary circuit can include TFTs for which particularly high consistency is not required. Thus, active layers of all the TFTs constituting one unitary circuit are formed from one first semiconductor island.

In addition, either the laser-light scanning direction or the shape of the first semiconductor island is determined so that, upon laser light irradiation onto the first semiconductor island, when a laser light spot has reached an end portion of the first semiconductor island, the laser light spot and the first semiconductor island contact at one point as viewed from either the obverse surface or reverse surface of the substrate. For example, laser light is scanned along a path so that a laser light spot first contacts one point of the summit of the first semiconductor island. Alternatively, when the scanning direction has already been determined, the shape of the first semiconductor island is determined so that a laser light spot first contacts one point of the summit of the first semiconductor island. Even when either a portion or the entirety of the periphery of the first semiconductor island is curved, the scanning direction of laser light or the shape of the first semiconductor island is determined so that a laser light spot and the end portion of the first semiconductor island first contact at one contact point. According to the above-described arrangement, when crystallization having an orientation rate of (100) plane develops from the one point at which the laser light spot has first contacted, and laser irradiation to the first semiconductor island is completed, the orientation rate of the (100) plane in the first semiconductor island can be increased.

In addition, as shown in FIG. 21A, scanning may be performed so that a laser light spot first contacts one point of the summit of the first semiconductor island. In the case shown in FIG. 21A, a laser light spot moves in the direction shown by arrows, and contacts summits 2104, 2105, and 2106 of a first semiconductor island 2101. Thereafter, the crystallization proceeds in the directions of arrows shown in FIG. 21B. Consequently, as shown in FIG. 21C, a crystallized first semiconductor layer 2107 is obtained.

Meanwhile, regions 2108 and 2109 of FIG. 21C are shown as regions poor in crystallinity, in which the second semiconductor islands are not preferably formed. Subsequent to the processing described above, patterning is performed, and a second semiconductor island 2110 is thus obtained, as shown in FIG. 21D.

Thus, TFTs are formed using as active layers one or a plurality of second semiconductor islands formed from the first semiconductor island crystallized as described above. Therefore, it is possible to make the TFTs uniform in characteristics as compared with ordinary TFTs. Consequently, a semiconductor circuit including the unitary circuit such as the above-described current mirror circuit, differential amplifier circuit, or operational amplifier circuit can be formed on a substrate by using the TFTs.

A description will be given of structures of the present invention below.

According to the present invention, there is provided a manufacturing method for a semiconductor device, comprising:

forming an amorphous semiconductor layer on a substrate;

patterning the amorphous semiconductor layer into a desired shape to form first semiconductor islands and markers;

irradiating laser light converged into an elliptical or a rectangular shape to a region including the first semiconductor islands while performing scanning relatively to the substrate to crystallize the first semiconductor islands;

patterning the crystallized first semiconductor islands into desired shapes, and forming second semiconductor islands; and forming thin-film transistors using the second semiconductor islands as active layers and configuring a circuit by using the thin-film transistors, wherein active layers of all of thin-film transistors included in a unitary circuit included in the semiconductor device are formed of any one of the crystallized first semiconductor islands.

According to the present invention, there is provided the manufacturing method for a semiconductor device, comprising:

forming an amorphous semiconductor layer on a substrate;

forming a metal-containing layer on the amorphous semiconductor layer, and obtaining a first crystalline semiconductor layer by heat treatment;

patterning the first crystalline semiconductor layer into a desired shape to form first semiconductor islands and markers;

irradiating laser light converged into an elliptical or a rectangular shape onto a region including the first semiconductor islands while performing scanning relatively to the substrate to obtain the first semiconductor islands constituted of second crystalline semiconductor layers;

patterning the first semiconductor islands constituted of the second crystalline semiconductor layers into desired shapes to form second semiconductor islands; and forming thin-film transistors using the second semiconductor islands as active layers, and configuring a circuit by using the thin-film transistors, wherein the second semiconductor islands serving as active layers of all of thin-film transistors included in a unitary circuit included in the semiconductor device are formed of any one of the first semiconductor islands constituted of the second crystalline semiconductor layers.

In the manufacturing method for a semiconductor device of the present invention, all the thin-film transistors are disposed so that charge movement directions in channel formation regions thereof are consistently arranged parallel or equivalent thereto.

In the manufacturing method for a semiconductor device of the present invention, the unitary circuit is any one of a current source, a current mirror circuit, a differential amplifier circuit, and an operational amplifier circuit.

In the manufacturing method for a semiconductor device of the present invention, the laser light is oscillated from any one of a continuous-wave solid laser, a gas laser, and a metal laser.

In the manufacturing method for a semiconductor device of the present invention, the laser light is oscillated from one laser selected from the group consisting of a continuous-wave YAG laser, $YVO_4$ laser, YLF laser, $YAlO_3$ laser, glass laser, ruby laser, alexandrite laser, and Ti:sapphire laser.

In the manufacturing method for a semiconductor device of the present invention, the laser light is oscillated from one laser selected from the group consisting of a continuous-wave excimer laser, Ar laser, Kr laser, and $CO_2$ laser.

In the manufacturing method for a semiconductor device of the present invention, the laser light is oscillated from one laser selected from the group consisting of a continuous-wave helium-cadmium laser, copper vapor laser, and gold vapor laser.

According to the present invention, there is provided a semiconductor device, wherein:

an amorphous semiconductor layer is formed on a substrate;

the amorphous semiconductor layer is patterned into a desired shape to form first semiconductor islands and markers;

laser light converged into an elliptical or a rectangular shape is irradiated to a region including the first semiconductor islands while performing scanning relatively to the substrate to crystallize the first semiconductor islands;

the crystallized first semiconductor islands are patterned into desired shapes and second semiconductor islands are formed;

thin-film transistors using the second semiconductor islands as active layers are formed to configure a circuit by using the thin-film transistors; and the second semiconductor islands serving as active layers of all of thin-film transistors included in a unitary circuit included in the semiconductor device are formed of any one of the crystallized first semiconductor islands.

According to the present invention, there is provided the semiconductor device, wherein:

an amorphous semiconductor layer is formed on a substrate;

a metal-containing layer is formed on the amorphous semiconductor layer to obtain a first crystalline semiconductor layer by heat treatment;

the first crystalline semiconductor layer is patterned into a desired shape to form first semiconductor islands and markers;

laser light converged into an elliptical or a rectangular shape is irradiated onto a region including the first semiconductor islands while performing scanning relatively to the substrate to obtain the first semiconductor islands constituted of second crystalline semiconductor layers;

the first semiconductor islands constituted of the second crystalline semiconductor layers are patterned into desired shapes to form second semiconductor islands;

thin-film transistors using the second semiconductor islands as active layers are formed to configure a circuit by using the thin-film transistors; and the second semiconductor islands serving as active layers of all of thin-film transistors included in a unitary circuit included in the semiconductor device are formed of any one of the first semiconductor islands constituted of the second crystalline semiconductor layers.

According to the present invention, there is provided the semiconductor device which has a circuit configured using a plurality of thin-film transistors, comprising one or a plurality of unitary circuits, wherein the second semiconductor islands serving as active layers of all of thin-film transistors included in the unitary circuit are synchronously formed by patterning one first semiconductor island into a desired shape.

According to the present invention, there is provided the semiconductor device which has a circuit configured using a plurality of thin-film transistors, comprising one or a plurality of unitary circuits, wherein:

the second semiconductor islands serving as active layers of all of thin-film transistors included in the unitary circuit are synchronously formed by patterning one first semiconductor island into a desired shape; and all the thin-film transistors included in the unitary circuit are disposed so that charge movement directions in channel formation regions thereof are consistently arranged parallel or equivalent thereto.

According to the present invention, there is provided the semiconductor device which has a circuit configured using a plurality of thin-film transistors, comprising one or a plurality of unitary circuits, wherein:

the second semiconductor islands serving as active layers of all of thin-film transistors included in the unitary circuit are synchronously formed by patterning one first semiconductor island into a desired shape; and all the thin-film transistors included in the unitary circuit are disposed so that charge movement directions in channel formation regions thereof are consistently arranged parallel with a scanning direction of laser light that is irradiated to crystallize the first semiconductor islands or equivalent thereto.

According to the present invention, there is provided the semiconductor device, wherein the unitary circuit is any one of a current source, a current mirror circuit, a differential amplifier circuit, and an operational amplifier circuit.

BRIEF DESCRIPTION OF THE DRAWINGS

In the accompanying drawings:

FIGS. 4A to 4F illustrate generation of a synthesized laser light spot from a plurality of laser light spots;

DETAILED DESCRIPTION OF THE PREFERRED EMBODIMENTS

Hereinbelow, an embodiment mode of the present invention will be described with reference to FIGS. 1A to 1D.

Figure 1A:
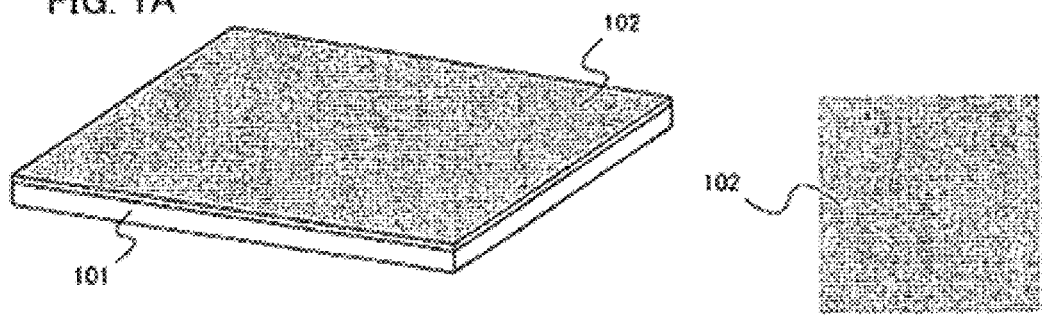
FIGS. 1A to 1D are explanatory views of an embodiment of the present invention.

A semiconductor film 102 is formed on a substrate 101 (FIG. 1A). The substrate 101 may be formed of a material that can withstand processing temperatures throughout the manufacture of the semiconductor device. For example, the substrate 101 may be any one of a quartz substrate, a silicon substrate, a non-alkali glass substrate such as a barium borosilicate glass substrate or an aluminoborosilicate glass substrate, or a substrate created by forming an insulation film on the surface of a metal substrate. Alternatively, the substrate 101 may be a plastic substrate having heat resistance sufficient to withstand processing temperatures during the manufacture.

A base film may be formed using, for example, an insulation film or the like between the substrate 101 and the semiconductor layer 102 to prevent the semiconductor layer 102 from being contaminated with impurity such as alkali metal contained in the substrate 101.

The semiconductor layer 102 may be deposited using a known technique (such as a sputtering method, an LPCVD method, or a plasma CVD method). The semiconductor layer 102 may be any one of an amorphous semiconductor layer, a microcrystalline semiconductor layer, and a polycrystalline semiconductor layer.

Figure 1B:
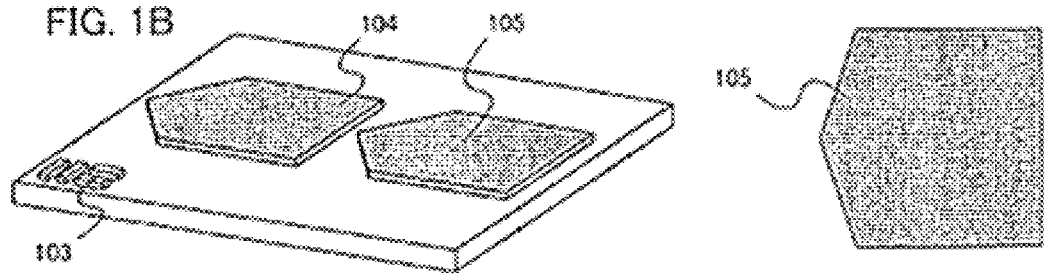

Subsequently, the semiconductor layer 102 is patterned; and an alignment marker 103 and first semiconductor islands 104 and 105 are thus formed (FIG. 1B). In this case, the shapes of alignment marker 103 and the first semiconductor islands 104 and 105 are not limited to those shown in FIG. 1B.

Figure 1C:
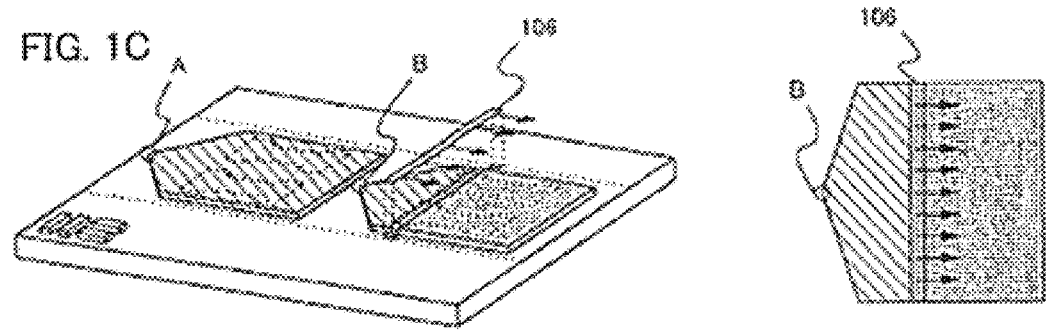

Then, as shown in FIG. 1C, a laser irradiation position is determined according to the alignment marker 103, and a semiconductor layer used to form the first semiconductor islands 104 and 105 is crystallized by irradiating laser light 106 onto the portions of the first semiconductor islands 104 and 105 in a laser irradiation step. Here, in the case where the semiconductor layer used to form the first semiconductor islands 104 and 105 have been crystallized to a certain extent, the crystallinity thereof can be thus increased thus in the laser irradiation step. In this case, a region with a low energy density is shielded by a slit (not shown) so that the semiconductor layer is not exposed to the laser light. When the semiconductor layer is irradiated with laser light having a low energy density to be crystallized, crystal grains thereof are fined to be microcrystal grains of about 0.1 $\mu$m or smaller. With a crystalline semiconductor layer composed of such microcrystal grains, sufficient electrical characteristics cannot be obtained.

Whether the energy density in the laser irradiation is sufficient is determined according to whether or not desired crystal grains can be obtained in the semiconductor layer crystallized by the laser irradiation. The sufficiency may appropriately be determined by a designer. As such, when the designer has determined crystallinity insufficient, the energy density in that case is determined low.

The energy density of laser light is low near the end portion of a laser light spot obtained through the slit. As such, in the vicinity of the irradiated end portion, crystal grains are small, and there appear portions (ridges) projecting along crystal grain boundaries. For this reason, the laser light needs to be irradiated such that trails of the laser light spot (shown by dotted lines in FIG. 1C) do not overlap the first semiconductor islands 104 and 105. More specifically, the laser light needs to irradiated such that trails of the laser light spot do not overlap at least regions of the second semiconductor islands formed after the first semiconductor islands 104 and 105 (the regions are shown by dotted lines in the first semiconductor islands 104 and 105 in FIG. 1C).

Either the laser-light scanning direction or the shape of the first semiconductor island is determined so that, in the stage of irradiating laser light onto the first semiconductor island, when a laser light spot has reached an end portion of the first semiconductor island, the laser light spot and the first semiconductor island contact at one point as viewed from either the obverse or reverse surface of the substrate. For example, laser light is scanned along a path so that a laser light spot first contacts one point of the summit of the first semiconductor island. Referring to FIG. 1C, the respective first semiconductor islands 104 and 105 contact the laser light spot at points A and B.

In this way, when irradiation with laser light is started from one contact point, and the first semiconductor island is crystallized, crystal having a (100) orientation surface grows from the vicinity including the contact point. As a result, the orientation rate of the (100) plane can be increased in the first semiconductor island. That is, since the crystal grains have the same orientation surface, electrons or holes near the grain boundary are moved smooth, so that such a crystalline semiconductor layer has very high field-effect mobility.

In the present invention, a known laser may be used to irradiate the semiconductor layer. More specifically, a pulse oscillation or CW (continuous wave) gas laser or solid laser. Gas lasers that may be used include, for example, an excimer laser, an Ar laser, and a Kr laser. Solid-state lasers that may be used include, for example, a YAG laser, a $YVO_4$ laser, a YLF laser, a $YAlO_3$ laser, a glass laser, a ruby laser, alexandrite laser, and a Ti:sapphire laser. In addition, solid-state lasers that may be employed include, for example, lasers using crystals of YAG, YVO$_4$, YLF, YAlO$_3$, and the like doped with Cr, Nd, Er, Ho, Ce, Co, Ni, or Tm. The fundamental of the laser to be used depends on the material to be doped, and a laser light having a fundamental of about 1 μm can be obtained. Harmonics corresponding to the fundamental can be obtained by use of a nonlinear optical element.

In addition, in the present invention, ultraviolet laser light may be used. The ultraviolet laser light is obtained such that infrared laser light emitted from a solid-state laser is modulated by a nonlinear optical element into green laser light, and the light is further modulated by another nonlinear optical element.

The alignment marker 103 may not necessarily be irradiated with the laser in all cases.

Figure 1D:
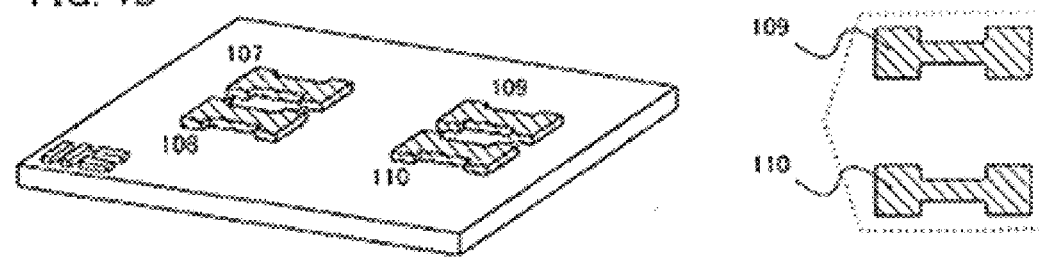
Figure 2A:
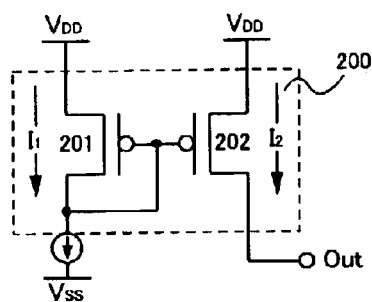
FIGS. 2A to 2D show example circuits (a current mirror circuit and a differential amplifier circuit) that require particularly high consistency of TFTs constituting a circuit.
Figure 2B:
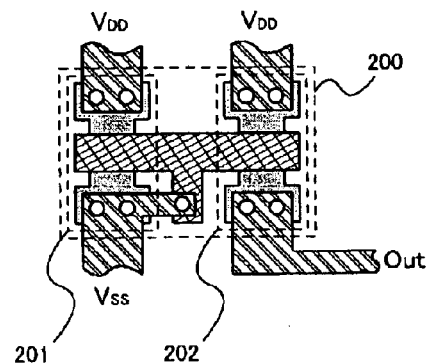
Figure 2C:
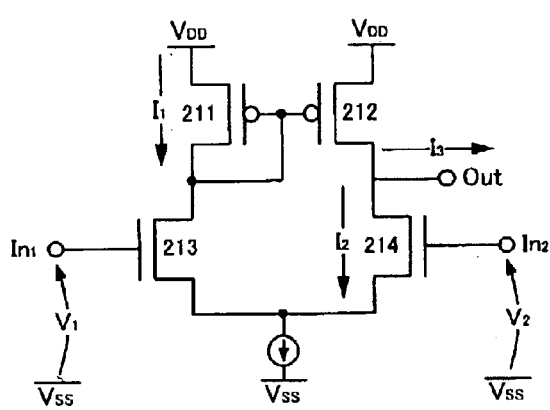
Figure 2D:
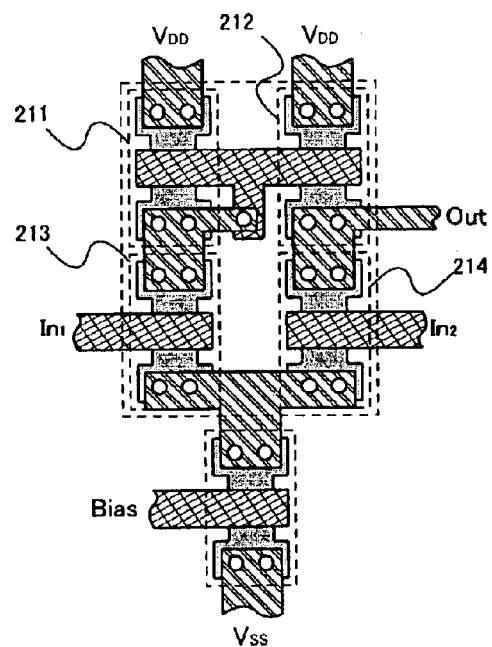

Subsequently, as shown in FIG. 1D, the crystallized first semiconductor islands 104 and 105 are patterned, and second semiconductor islands 107 to 110 each having a desired shape are thus formed. The second semiconductor islands 107 to 110 are desirably formed on regions in the vicinity of the center the first semiconductor island where satisfactory crystallinity has been obtained, avoiding the vicinities of end portions of the first semiconductor island. The alignment marker 103 may be left for use as an alignment mark for mask that will be used in later steps (for forming a gate electrode, wirings, and the like).

Figure 3A:
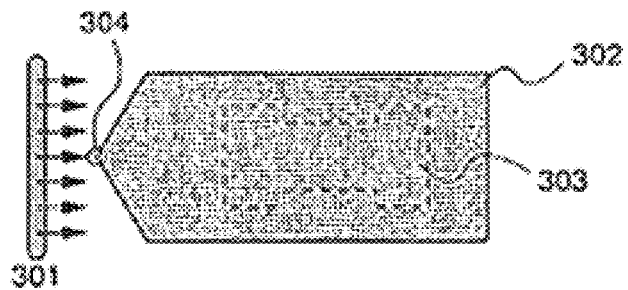
FIGS. 3A to 3F show steps from the formation of a first semiconductor island to the formation of a TFT, and a cross section of the TFT.
Figure 3B:
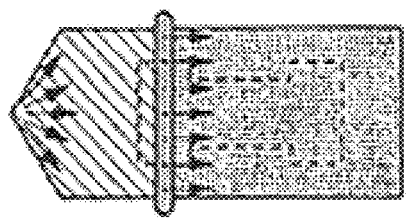
Figure 3C:
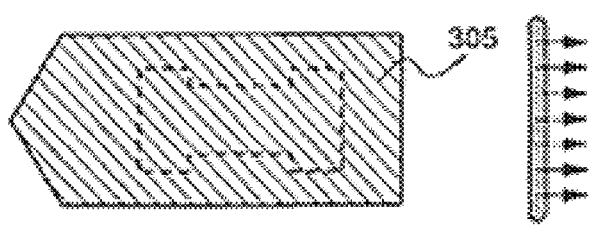
Figure 3D:
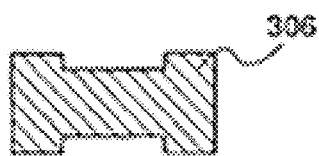
Figure 3E:
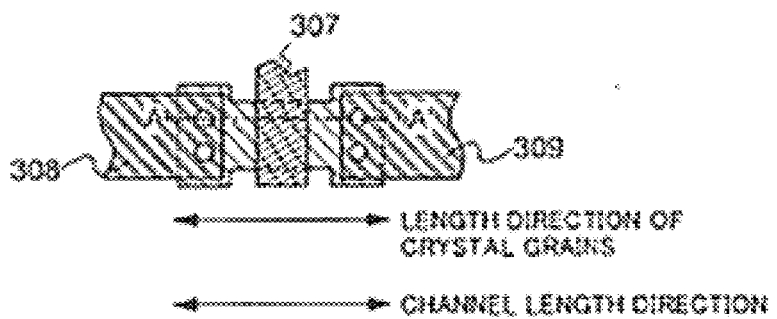
Figure 3F:
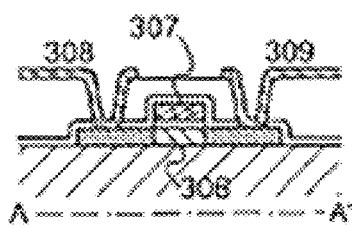

FIGS. 3A to 3D briefly show the steps described above. Thereafter, a gate electrode 307 and source-drain wirings 308 and 309 are formed, and a TFT is thus formed. FIG. 3F is a cross-sectional view taken along the line A–A' of FIG. 3E. In this case, for simplification, only a second semiconductor island 306 is formed from a first semiconductor island 302. In practice, however, a plurality of second semiconductor islands are formed as active layers for a plurality of TFTs that are required to be consistent in a circuit configuration; and the layers are formed into TFTs in a similar step as described above.

The second semiconductor islands 107 and 108 formed of the single first semiconductor island mutually have the uniform crystallinity. Similarly, the second semiconductor islands 109 and 110 formed from the single first semiconductor island mutually have uniform electrical characteristics. As such, TFTs formed using the second semiconductor islands 107 and 108 as active layers have uniform electrical characteristics; and TFTs formed using the second semiconductor islands 109 and 110 as active layers have uniform characteristics. Accordingly, these TFTs can be used suitable for the manufacture of a circuit, such as a current mirror circuit of the type described above, which requires high consistency among configuration elements.

As described above, according to the present case, the second semiconductor islands are formed from each of the first semiconductor islands 104 and 105. However, the present invention does not limit the number of second semiconductor islands formed from a first semiconductor island. Specifically, the aforementioned number may be arbitrarily determined so that one first semiconductor island is used to form second semiconductor islands used as active layers for TFTs for which consistency is required among TFTs that are required to constitute a circuit.

Figure 19A:
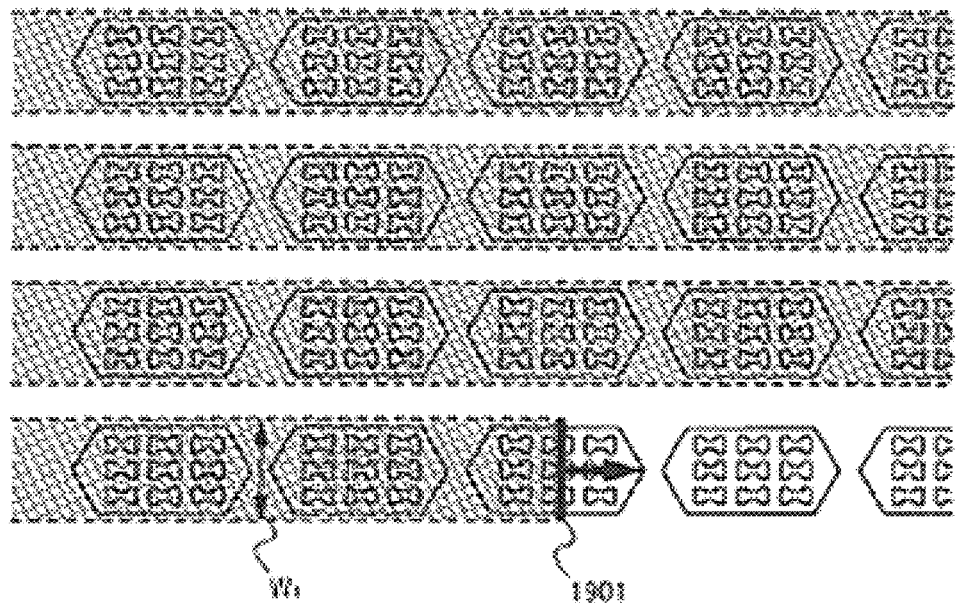
FIGS. 19A and 19B are explanatory views of changes in laser-light irradiation widths during irradiation of substrates.
Figure 19B:
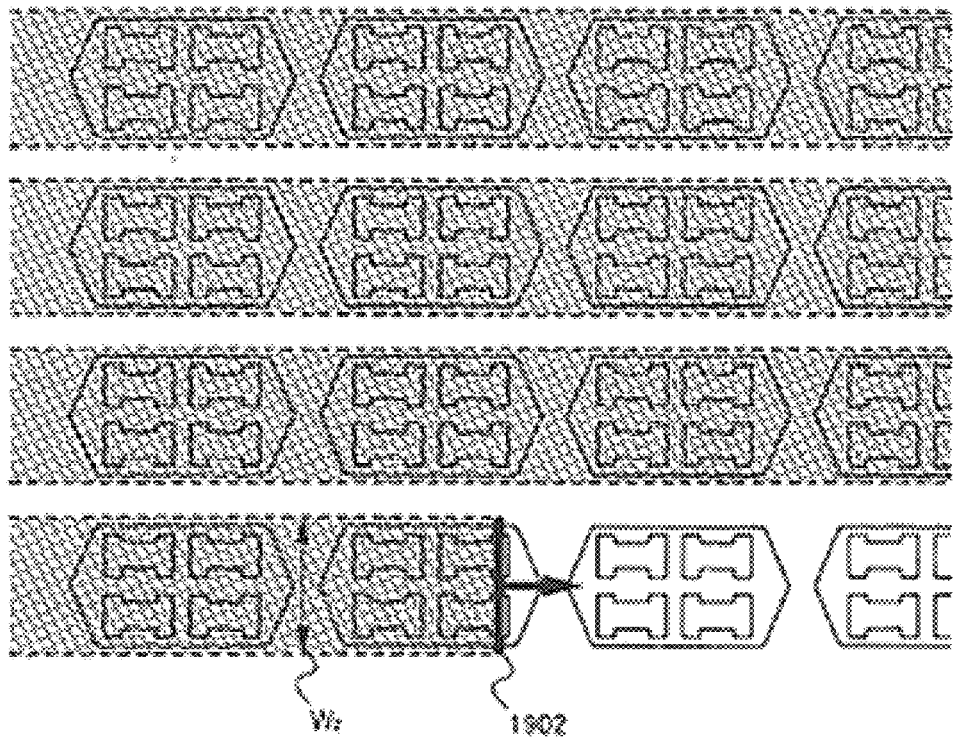

The beam spot width may appropriately be changed depending on the size of either the first semiconductor island or the second semiconductor island. For example, a TFT of a driver circuit desired to process flows of relatively large current has a relatively large channel width; accordingly, the size of a second semiconductor island tends to be large relative to the pixel portion. FIGS. 19A and 19B show cases where laser light is scanned by changing the slit width for first semiconductor islands of two sizes. Specifically, FIG. 19A shows the relationship between a laser-light scanning portion and the first semiconductor island in a case where the first semiconductor island having a short length perpendicular to the scanning direction. Similarly, FIG. 19B shows the same relationship in a case where the first semiconductor island having a long length perpendicular to the scanning direction.

Referring to FIGS. 19A and 19B, when the width of a spot 1901 of FIG. 19A is denoted by $W_1$, and the width of a spot 1902 in FIG. 19B is denoted by $W_2$, the relationship therebetween is expressed as $W_1 < W_2$. As a matter of course, the spot widths are not limited to those shown in the figures, but may arbitrarily be set within an allowable margin of the width in the direction perpendicular to the scanning direction among first semiconductor islands.

According to the present invention, as shown in FIGS. 19A and 19B, laser light is not irradiated onto the overall substrate, but the spot thereof is scanned so that at least the portions of the first semiconductor islands can be crystallized. Thus, the overall substrate is not irradiated, and only minimum portions are irradiated so that the portions of the first semiconductor islands are crystallized. Thus, the processing time required for one substrate can be minimized. Accordingly, the substrate-processing efficiency can be improved.

Embodiments

Hereinbelow, embodiments will be described.

[Embodiment 1]

This embodiment describes an example of a laser crystallization process using a CW laser.

A CW laser suitable for the process is one having a wavelength of 550 nm or less and having highly stable power. For example, the second harmonic of a YVO$_4$ laser, the second harmonic of a YAG laser, the second harmonic of a YLF laser, the second harmonic of a YAlO$_3$ laser, and an Ar laser meet the requirement. The third or higher harmonic of these lasers may also be used. Alternatively, a ruby laser, an alexandrite laser, a Ti:sapphire laser, a continuous wave excimer laser, Kr laser, or CO$_2$ laser, or a continuous wave helium cadmium laser, copper steam laser, or gold steam laser may be employed. It is also possible to employ plural lasers of one type or different types chosen from those lasers.

Figure 7:
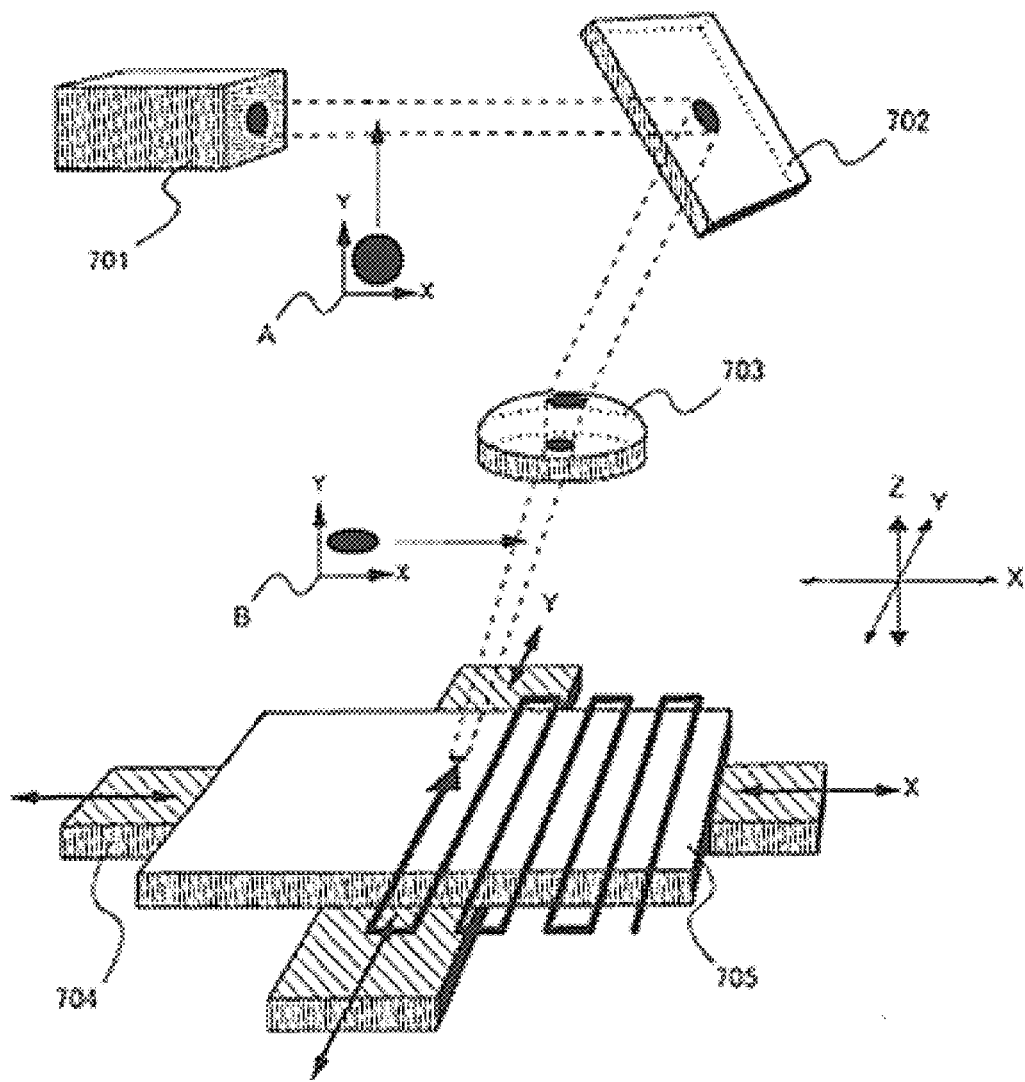
FIG. 7 is a schematic view of a laser-light irradiation procedure.

FIG. 7 is a schematic representation of an apparatus for CW laser crystallization. The apparatus is composed of a laser oscillator 701, a mirror 702, a convex lens 703, an X-Y stage 704, etc. The laser used here is a 10 W power continuous wave YVO$_4$ laser. The laser oscillator 701 is provided with a non-linear optical element and emits the second harmonic from its exit.

A laser beam emitted from the laser oscillator 701 has a circular shape as is indicated by A in FIG. 7. The laser beam is emitted in the horizontal direction and is deflected by the mirror 702 toward the direction about 20° from the vertical direction. Thereafter, the beam is collected by the convex lens 703 positioned in the horizontal direction. A substrate 705 is fixed to the X-Y stage 704 and an irradiation surface on a semiconductor layer that is formed on the substrate is brought to the focus of the convex lens 703. At this point, the irradiation surface is arranged such that it is in parallel with the convex lens 703. In other words, the substrate 705 is arranged horizontally. The laser beam enters the convex lens 703 at about 20° and therefore the laser beam obtains an elliptical shape on the irradiation surface due to astigmatism of the convex lens. The laser beam shape on the irradiation surface is determined by the incident angle at which the laser beam enters the convex lens 703. Accordingly, the laser beam can have an elliptical shape of larger aspect ratio by making it enter the convex lens at a larger angle to the vertical direction. On the other hand, this makes the penetration shallow and uniform irradiation difficult. The suitable deflection angle is therefore about 20°.

In order to crystallize semiconductor layers on the entire surface of the substrate, it is necessary to repeatedly run an elliptical beam over the substrate at a suitable irradiation pitch while shifting the beam in its longer diameter direction. This operation is achieved by fixing a laser output unit that is composed of the laser oscillator 701, the mirror 702, and the convex lens 703 while moving the X-Y stage 704 to move the substrate in a manner that makes the elliptical beam run over the substrate. When the substrate, i.e., the irradiation object, measures 600 mm in the X direction and 720 mm in the Y direction and the elliptical beam measures 200 μm in the longer diameter direction, it requires 3000 times of laser scanning (1500 times of reciprocation) in the direction shown in FIG. 7 to irradiate the entire surface of the substrate.

Detailed explanation will be given in subsequent embodiments, the number of scanning can be reduced and the processing time can be shortened by using plural laser oscillators and scanning the substrate with plural elliptical beams arranged side by side in the longer diameter direction of the ellipse. This way low energy density portions at the edges of a single laser beam overlap with low energy density portions at the edges of adjacent laser beams, thereby raising the energy density. As a result, the effective irradiation region is widened and the ratio of the effective irradiation region to the whole irradiation region in one irradiation is increased to further reduce limitations in circuit layout.

This embodiment may be combined with other embodiments.

[Embodiment 2]

Figure 8:
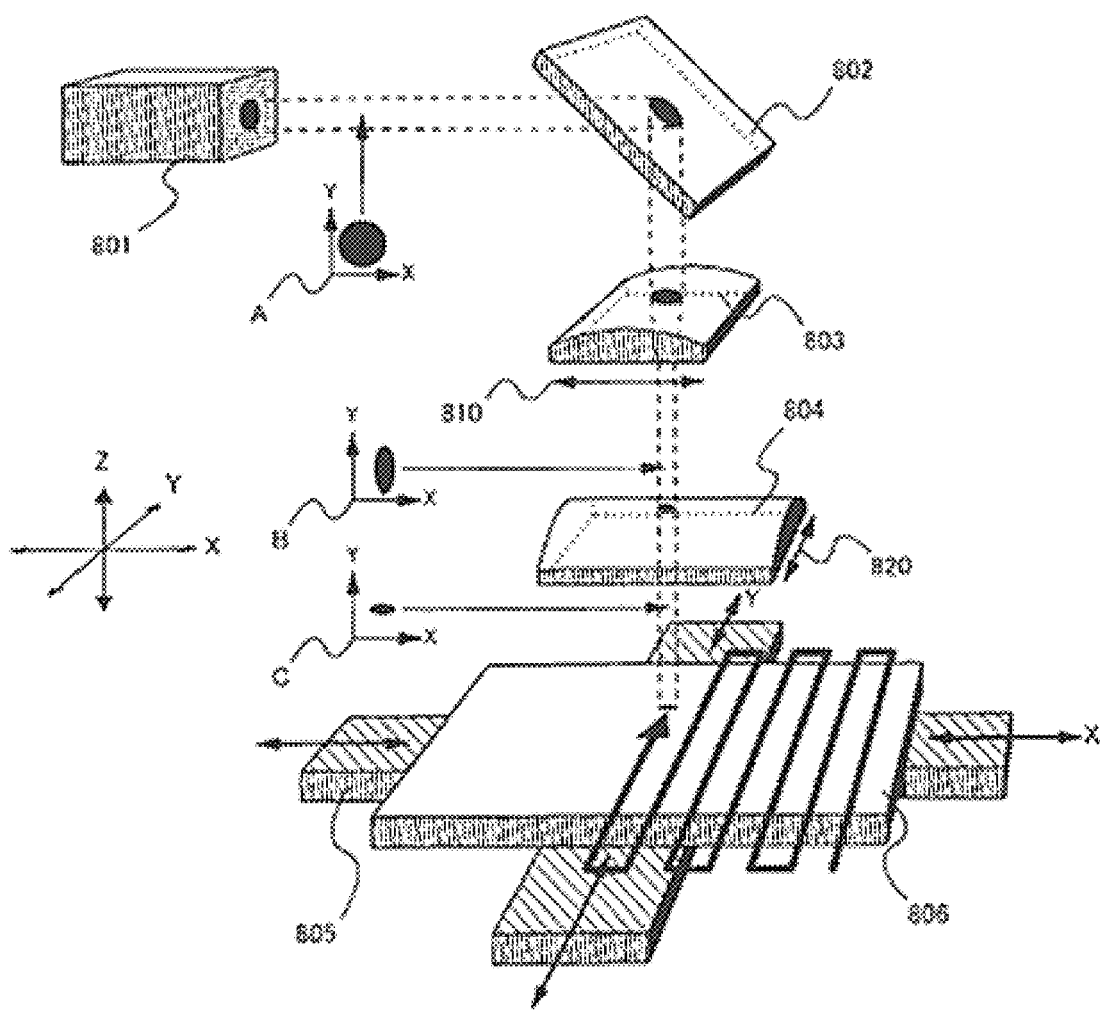
FIG. 8 is a schematic view of a laser-light irradiation procedure.

This embodiment gives a description with reference to FIG. 8 on an example of using an optical system different from the one in Embodiment 1 to polarize a laser beam.

A laser beam emitted from a laser oscillator 801 has a circular shape as indicated by A in FIG. 8. The laser beam is emitted in the horizontal direction and is deflected by a mirror 802 toward the vertical direction. Thereafter, the beam is collected by a first cylindrical lens 803 in the X direction. At this point, the circular shape of the laser beam is collected in the X direction and an elliptical shape with the longer diameter set in the Y direction is obtained as indicated by B in FIG. 8. The laser beam is then collected by a second cylindrical lens 804 in the Y direction. At this point, the laser beam is further collected in the Y direction and an elliptical shape with the longer diameter set in the X direction is obtained as indicated by C in FIG. 8. This optical system can provide an elliptical beam having an aspect ratio even larger than that of the laser beam shown in Embodiment 2. A substrate 806 fixed to an X-Y stage 805 is irradiated with this elliptical laser beam. For laser beam scanning over the substrate, see Embodiment 1.

Figure 4A:
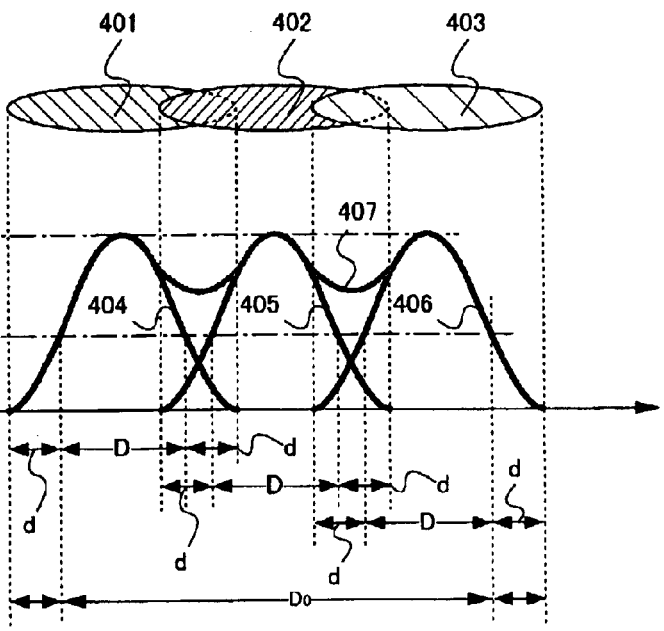

The number of scanning can be reduced and the processing time can be shortened by using plural laser oscillators and scanning the substrate with plural elliptical beams arranged side by side in the longer diameter direction of the ellipse as shown in FIG. 4A. This way low energy density portions at the edges of a single laser beam overlap with low energy density portions at the edges of adjacent laser beams, thereby raising the energy density. As a result, the effective irradiation region is widened and the ratio of the effective irradiation region to the whole irradiation region in one irradiation is increased to further reduce limitations in circuit layout.

This embodiment may be combined with other embodiments.

[Embodiment 3]

Figure 6A:
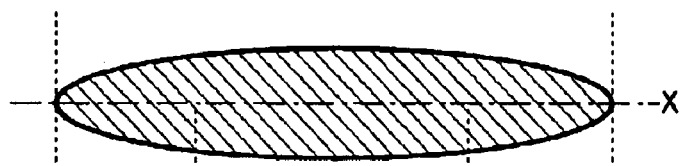
FIGS. 6A to 6C are explanatory views of a laser light spot and an energy density distribution thereof.

When crystallizing the semiconductor layer by using the CW laser according to the steps described in the embodiment mode, the shape of laser light oscillated by a single laser oscillator on an irradiation subject surface is either elliptical or rectangular. The laser light is converged into a spot state to increase the energy density on the irradiation surface, and the irradiation range is as shown in FIG. 6A.

Figure 6B:
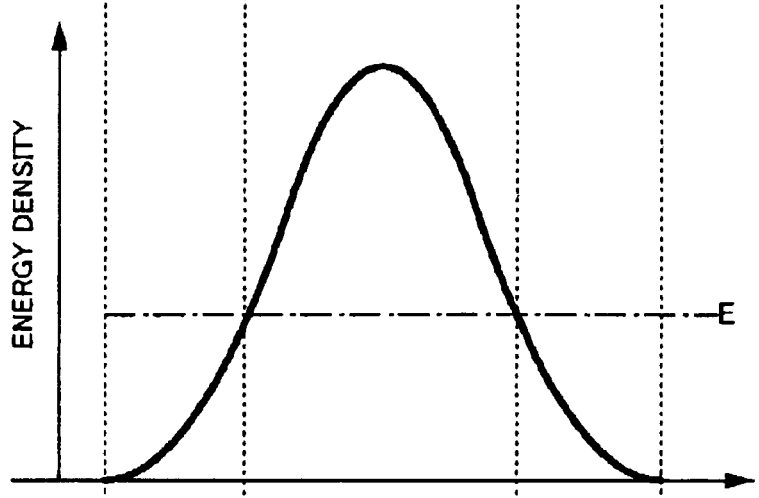

The energy density is further distributed in the laser light converged into the spot state. FIG. 6B shows an energy distribution in the longitudinal direction and on an X cross-sectional plane, that is, in the longitudinal-axis direction of the ellipse.

Figure 6C:
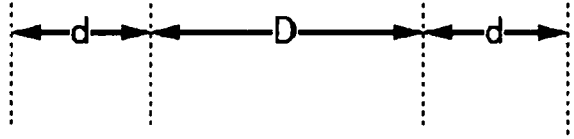

As is shown in FIG. 6B, in the laser-light spot, a distribution is exhibited such that the energy density gradually decreases in the direction from the central portion to the end portion. In the drawing, the symbol "E" denotes an energy density minimally required for satisfactory crystallization of the semiconductor layer. FIG. 6C shows a state where the semiconductor layer irradiated with laser light in a range D is crystallized satisfactorily, thereby proving that the semiconductor has high electrical characteristics. However, in a region of the semiconductor layer irradiated with laser light in a range d, since the energy density of the laser light is insufficient, melting ability is insufficient, thereby causing microcrystallization. In this region, since sufficient electrical characteristics cannot be obtained, the region is not suitable for use as an active layer.

For manufacturing a plurality of TFTs using the semiconductor layer obtained by patterning the single first semiconductor island as in the present invention, the range is desirably wider than that of the region D. However, since the increasing of the laser-light spot size is limited, when a circuit is configured within the limited width, difficulties arise in determining the device layout. Consequently, for example, wirings and the like need to be led out long, thereby making an inefficient circuit layout.

In this embodiment, an example method for implementing efficient laser irradiation by using laser light that is output from a plurality of laser oscillators will be described.

Referring to FIG. 4A, reference numerals 401 to 403 denote spots of laser light that have respectively been output from three different laser oscillators and that have been converged into spot states through optical systems. The laser-light spots 401 to 403 are shaped as ellipses in which the longitudinal axes of the individual ellipses are aligned linear and are partly overlapped with one another to be synthesized into one laser-light spot.

With reference numerals 404 to 406, FIG. 4B shows energy density distributions of the laser-light spots 401 to 403 in the longitudinal-axis direction. The energy densities of the individual spots are identical, in which values of the peaks are denoted by "$E_0$". With regard to the synthesized laser light spot, the energy densities of the overlapped regions are added together, thereby exhibiting energy density distributions as shown with numeral 407 in FIG. 4B.

In this case, the energy densities of the two spots are added together in each of the regions where the adjacent spots 404 and 405 are overlapped and where the adjacent spots 405 and 406 are overlapped. Each of the regions has an energy density that is sufficient for satisfactory crystallization of the semiconductor layer. Therefore, after the synthesization, the shape of the spot is changed into a shape as shown with numeral 408 in FIG. 4C. In this case, a range in which satisfactory crystallization of the semiconductor layer can be performed is as denoted by "$D_0$" in FIG. 4B.

The sum of energy densities of the regions where the adjacent spots are overlapped is ideally identical to the peak value $E_0$ of the single spot. However, the spot-overlapping width may appropriately be set within the range $D_0$ to a value range suitable for obtaining satisfactory and uniform crystallization of the semiconductor layer.

Figure 4C:

Thus, as can be seen from FIGS. 4A to 4C, the laser irradiation can be implemented with the increased width in the manner that the plurality of laser-light spots are overlapped, and regions of low energy densities are mutually compensated.

Figure 5A:
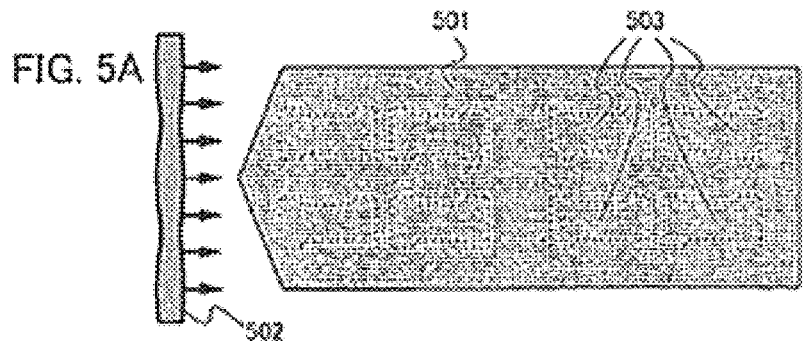
FIGS. 5A to 5E show an example circuit constituted of TFTs using a first semiconductor island crystallized by a synthesized laser light spot, and second semiconductor islands formed of the first semiconductor island.
Figure 5B:
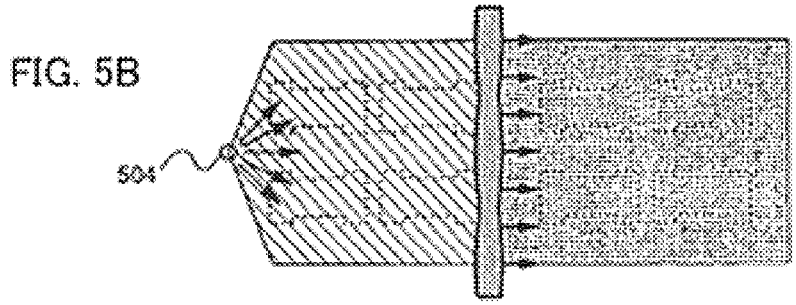
Figure 5C:
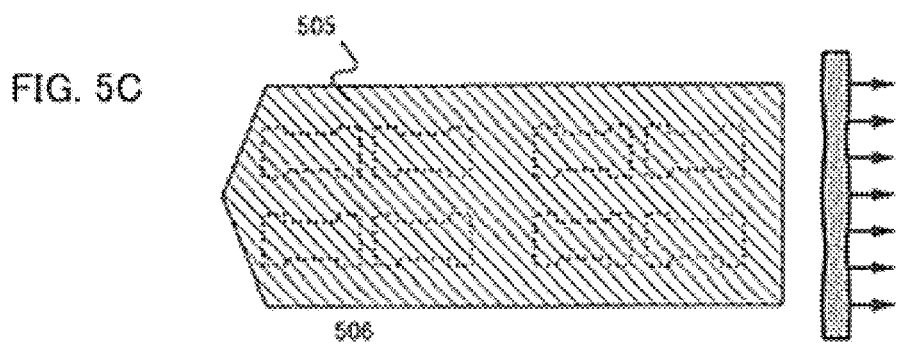

As a result of using the method described above, as illustrated in FIGS. 5A to 5C, using a synthesized laser light spot 502, only one scanning operation enables the crystallization of a wide (large width) first semiconductor island 501 on which a plurality of second semiconductor islands 503 are to be formed. Accordingly, upon the first contact at one point shown with numeral 504 in FIG. 5B with the laser light spot, the first semiconductor island 501 starts crystallization, and crystal having a (100) orientation surface grows. As a result, a first semiconductor island 505 is obtained (FIG. 5D) in a crystallization state having satisfactory (100) orientation surface.

Figure 5D:
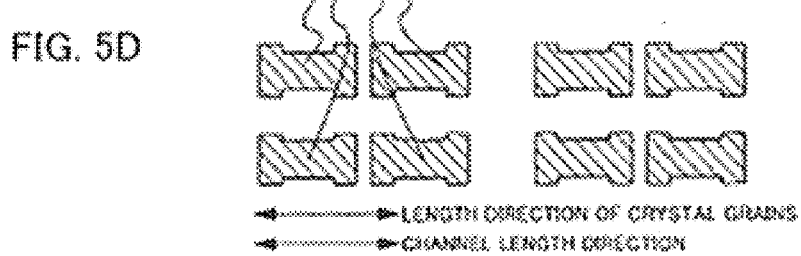

Further, as shown in FIG. 5D, second semiconductor islands 506 are formed through patterning. At this time, the layout is arranged such that the TFT channel-length direction, that is, the charge movement direction, conforms to the longitudinal-axis direction of crystal grain, that is, the direction parallel to the scanning direction of the laser light spot or equivalence thereof. This layout arrangement enables a reduction of instances where the movement of charge in TFT-channel-formed regions is hindered by crystal grain boundaries.

Figure 5E:
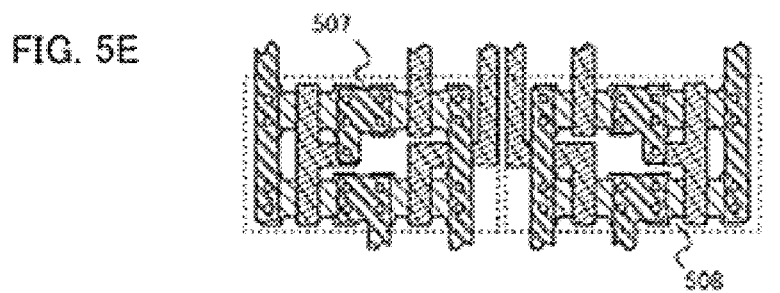

Subsequently, as shown in FIG. 5E, for example, gate electrodes, wirings, and the like are formed, and circuits are then completed. In the illustrated case, two of differential amplifier circuits 507 and 508 are formed.

Referring back to FIGS. 4A to 4F, use of the synthesized laser light spot is advantageous not only in that a simply wide area can be scanned, but also in the efficiency. While the width of the irradiated region is (D+2d) when a single laser light spot is used, the width of the irradiated region, is ($D_0$+2d) when a synthesized laser light spot as shown in FIG. 4C is used. In the former case, the ratio of the width in which satisfactory crystallization can be performed to one-scanning width of the laser light spot is (D/(D+2d)), whereas the aforementioned ratio is ($D_0$/($D_0$+2d)) in the latter case. Since D<$D_0$, it can be said that satisfactory crystallization can be implemented more efficiently.

Figure 4D:
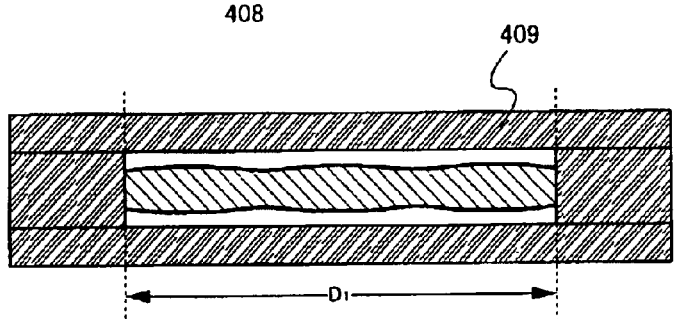

In addition, when using the synthesized laser light spot, as shown in FIG. 4D, the region where the energy density is low, situated at both ends in the longitudinal-axis direction is desirably shielded using a slit 409 not to be incident on the semiconductor layer. At this time, the spot on the surface of the semiconductor layer is shaped as shown in FIG. 4E; specifically, the spot is shaped similar to a rectangular having a width of $D_1$(<$D_0$) in the longitudinal-axis direction.

Figure 4F:
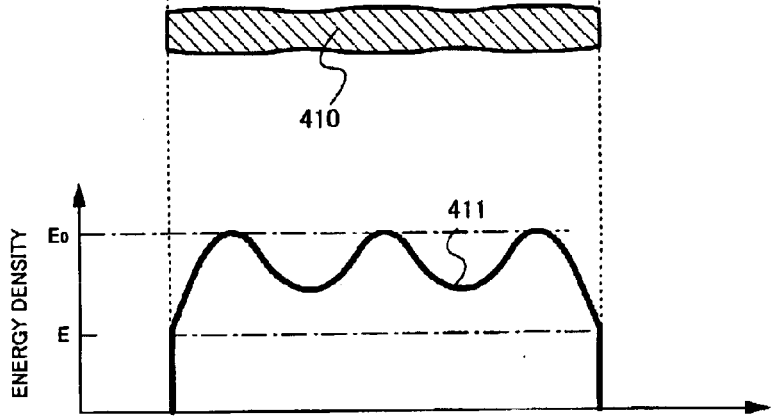

When using the laser light spot shaped as described above to irradiate the semiconductor layer, a region where the energy density is low does not exist in the light spot (FIG. 4F). Even if such a region exists, the width thereof is very small in comparison to a case without the slit being used. The above facilitates control of the spot position to be performed for preventing irradiation end portions of the laser light spot from being scanned over the first semiconductor island. Accordingly, the above arrangement enables reductions of constraints that can impose on determinations of the laser-light scanning path and the layout of either the first semiconductor islands or the second semiconductor islands.

Furthermore, by using the slit, the width of the laser light spot can be changed with the energy density being maintained constant and without terminating the output of the laser oscillator. Hence, irradiation end portions of the laser light spot can be prevented from being scanned over the second semiconductor island or the channel formation region thereof. Furthermore, the laser light can be irradiated also onto unnecessary regions of the substrate, thereby enabling effects to be expected for preventing the substrate from being damaged.

[Embodiment 4]

Hereinbelow, the configuration including a control system of a laser irradiation device used in the present invention will be described with reference to FIG. 9A. Reference numeral 901 denotes each of a plurality of laser oscillators. While the configuration of FIG. 9A uses three laser oscillators 901, the number of laser oscillators used for the laser irradiation device is not limited thereto.

Figure 9A:
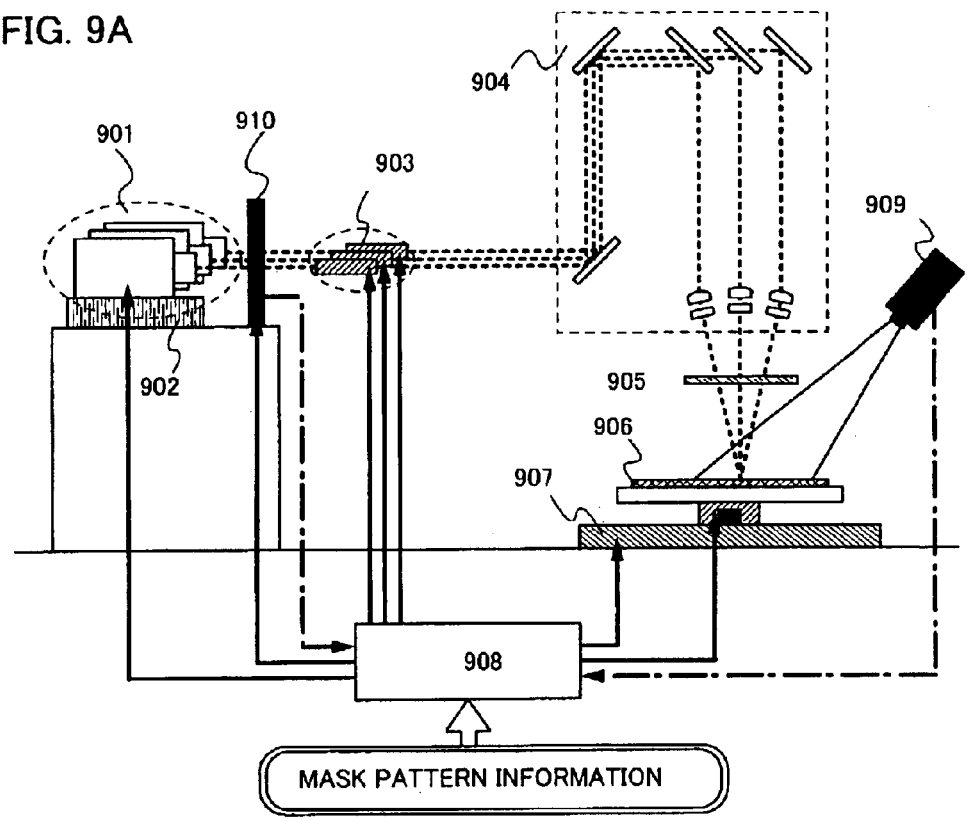
FIGS. 9A and 9B are schematic views of a laser irradiation device including a control system.

The laser irradiation device of FIG. 9A includes a computer 908 that includes, for example, a central processing unit and storage means such as a memory. The computer 908 is capable of controlling the oscillation of laser oscillators 901 and is concurrently capable of controlling a substrate 906 to move to a predetermined position. In this case, the position of the irradiation of a laser light spot onto the substrate 906 is controlled to cause the laser light spot to cover a region determined according to mask-pattern information.

The laser oscillator 901 may include a chiller 902 to be used to maintain the temperature thereof to be constant. The chiller 902 need not necessarily be provided. However, by maintaining the temperature of the laser oscillator 901 to be constant, the energy of laser light to be output can be prevented from being varied by the temperature.

Reference numeral 904 denotes an optical system 904 that is capable of converging the laser light in such a manner as to change the path of light that has been output from the laser oscillator 901 and to shape the laser light spot. In addition, in the laser irradiation device of FIG. 9A, laser light spots that have been output from the plurality of laser oscillators 901 are partly overlapped with each other through the optical system 904, and can thus be synthesized.

A plurality of AO modulators 903 capable of temporarily and completely blocking the laser light may be provided in light paths between the substrate 906 (processing target) and the laser oscillators 901. Alternatively, instead of the AO modulators 903, attenuators (light-quantity adjusting filters) may be provided to adjust the energy density of the laser light.

The configuration may be modified such that means 910 (energy density measuring means) for measuring the energy density of the laser light that has been output from the laser oscillator 901 is provided in the light path between the substrate 906 (processing target and the laser oscillator 901), and variations with time in the measured energy density are monitored using the computer 908. In this case, the output of the laser oscillator 901 may be increased to compensate for attenuation in the energy density of the laser light.

The synthesized laser light spot is irradiated onto the substrate 906 (processing target) via the slit 905. Desirably, the slit 905 is capable of blocking the laser light, and is formed of a material having sufficient resistance against damage or deformation that can be caused by laser light. In addition, the slit width of the slit 905 is preferably variable so that the width of the laser light spot can be changed according to the slit width.

When laser light oscillated by the laser oscillator 901 is not passed through the slit 905, the shape of the laser light spot on the substrate 906 is variable depending on the laser type, and the shape of the laser light spot can be rectified through the optical system.

The substrate 906 is mounted on an X-Y stage 907. In FIG. 9A, the X-Y stage 907 is controlled by a computer, and the irradiation position of the laser light spot is controlled by moving the processing target, that is, the substrate 906.

In the present invention, according to the computer 908, the width of the slit 905 is controlled, and the width of the laser light spot can be changed according to pattern information of a mask.

In addition, the laser irradiation device shown in FIG. 9A may include means for adjusting the temperature of the processing target. Further, since the laser light has high directivity and energy density, a damper may be provided to prevent reflected light from being irradiated onto an inappropriate portion. Desirably, the damper has a property of adsorbing reflected light, and cooling water is circulated in the damper to prevent the temperature of partition walls from being risen due to the absorption of reflected light. In addition, means (substrate-heating means) for heating the substrate 906 may be provided to the X-Y stage 907.

In a case where the alignment marker is to be formed using the laser, a marker-dedicated laser oscillator may be provided. In this case, oscillation of the marker-dedicated laser oscillator may be controlled using the computer 908. In the case where the marker-dedicated laser oscillator is provided, a separate optical system should be provided to converge laser light emitted from the marker-dedicated laser oscillator. For example, a YAG laser and a $CO_2$ laser are representative lasers that can be used to form the marker. Of course, a different laser can be used to form the marker.

One CCD camera 909 may be provided to perform alignment by using the marker. Depending on the necessity, two or more CCD cameras 909 may be provided.

Even when no specific marker is provided, the alignment can be performed by using the CCD camera 909. Specifically, the CCD camera 909 recognizes the pattern of the first semiconductor island, and the information of the pattern (pattern information) is used for alignment. More specifically, mask-attributed pattern information of the first semiconductor island that has been input to the computer 908 is compared with the pattern information of the first semiconductor island that has been stored in the CCD camera 909. As a result, information regarding the position of the substrate can be obtained. In this case, no specific marker needs to be provided.

Figure 9B:
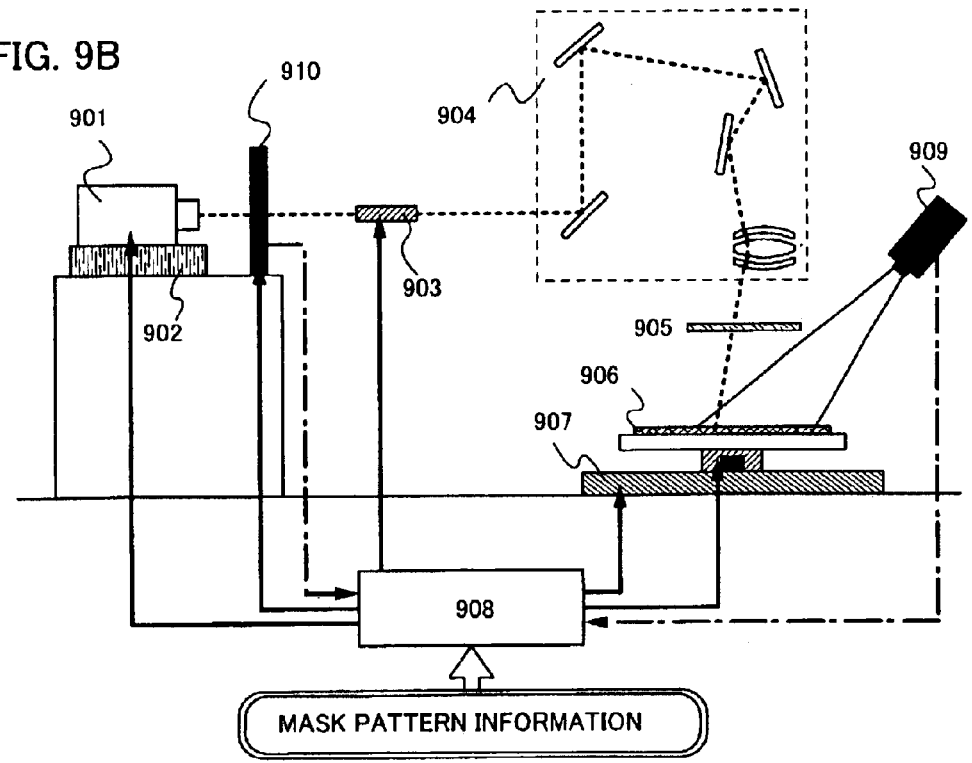

With reference to FIG. 9A, the configuration including the plurality of laser oscillators has been described, but the configuration may be modified to include one laser oscillator. FIG. 9B shows the configuration of a laser irradiation device using one laser oscillator. Referring to FIG. 9B, numeral 901 denotes the aforementioned laser oscillator, and numeral 902 denotes a chiller. Numeral 910 denotes an energy density measuring means 910, numeral 903 denotes an AO modulator, numeral 904 denotes an optical system, a numeral 905 denotes a slit, and numeral 909 denotes a CCD camera. A substrate 906 is mounted on an X-Y stage 907, whereby the position of irradiation of a laser light spot onto a substrate 906 is controlled. Similar to the configuration shown in FIG. 9A, operations of the individual means included in the laser irradiation device are controlled by the computer 908. Dissimilar to the configuration of FIG. 9A, however, the present configuration includes the one laser oscillator 901, as described above. Accordingly, unlike the configuration of FIG. 9A, also the optical system 904 may be provided with a function to converge laser light emitted from one laser source.

Figure 20A:
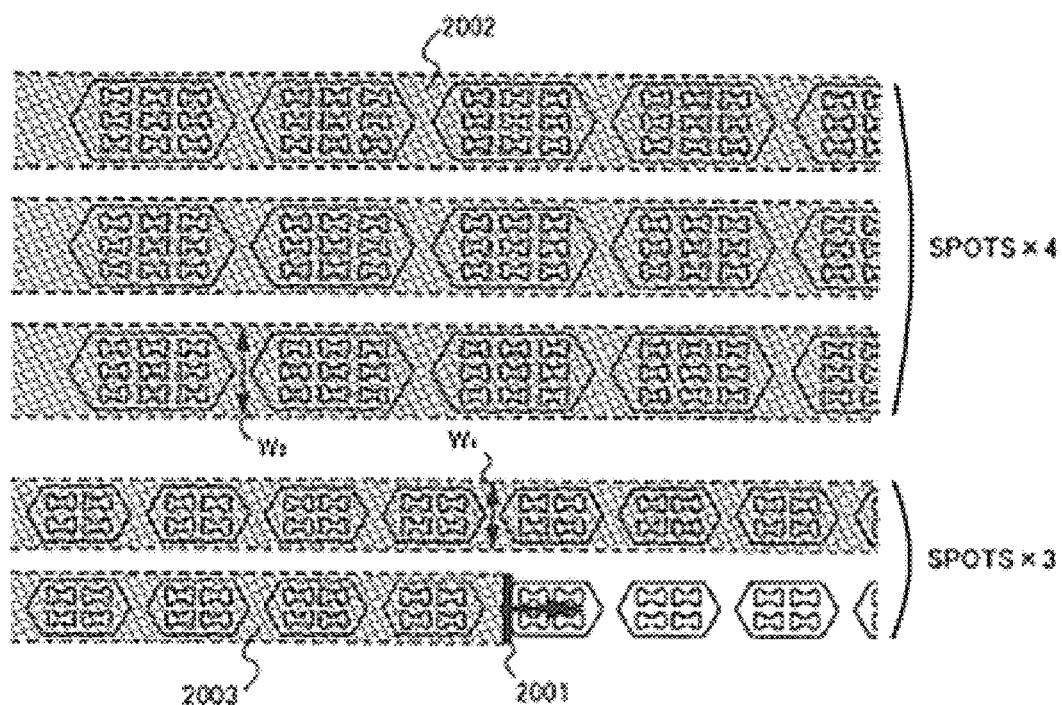
FIGS. 20A and 20B are explanatory views of changes in laser-light irradiation widths and blocking of the laser light during irradiation of substrates.

FIG. 20A shows an example of the relationship between the shape of mask for patterning a semiconductor layer and the width of a laser light spot 2001 when laser light is irradiated one time. In the drawing, shaded portions indicate portions irradiated with the laser light. Numeral 2002 denotes a portion scanned with a beam spot having a width $W_3$ obtained by synthesizing overlapped beams of laser light that have been output from four laser oscillators. Numeral 2003 denotes a portion scanned with laser light spot having a width $W_4$ obtained by synthesizing overlapped beams of laser light that have been output from three laser oscillators. The scanning width may be controlled through the slit; or output of a portion of the laser light may be stopped, or may be blocked using the AO modulator.

As in this embodiment, when the AO modulator is used, the width of the laser light spot 2001 can arbitrarily be changed without terminating output operations of all the laser oscillators. This enables the output to be prevented from being unstable due to termination of the output operation of the laser oscillator.

According to the configuration described above, since the width of the trail of the laser light can be changed, even when the width of the first semiconductor island is partly different as shown in FIG. 20A, edges of the trail of the laser light can be prevented from overlapping a semiconductor that is obtained by a patterning process. In addition, this embodiment enables the reduction in the probability of causing damage occurring on the substrate because of irradiation of the laser light onto unnecessary portions.

Hereinbelow, a description will be made regarding an example in which laser light is blocked by the AO modulator during laser-light irradiation so that the laser light is irradiated only onto a predetermined portion. While the laser light is thus blocked, the present invention is not limited thus, and any other means capable of blocking the laser light may be used.

In the present invention, portions scanned with the laser light are determined by the computer according to the mask information that has been input. In addition, in this embodiment, the AO modulator is used to block the laser light to be irradiated only onto a predetermined portion required to be scanned. In this case, the AO modulator is desirably capable of blocking the laser light and is formed of a material having sufficient resistance against deformation or damage that can be caused by the laser light.

Figure 20B:
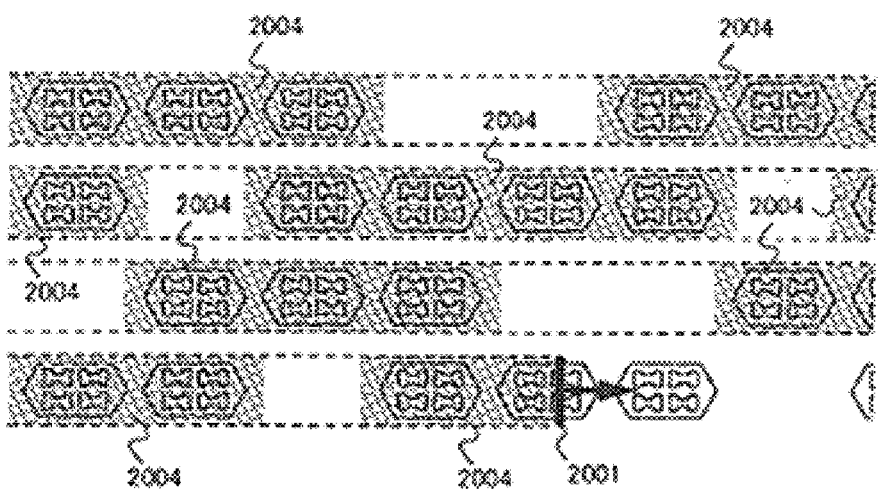
Figure 21A:
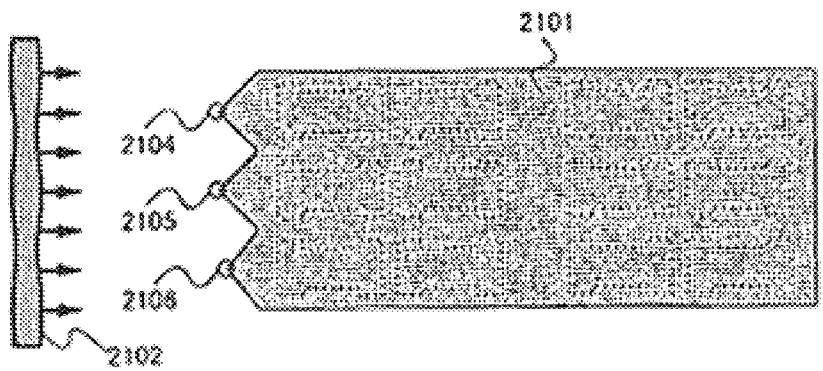
FIGS. 21A to 21D show example processes of forming second semiconductor islands after crystallization of a first semiconductor island.
Figure 21B:
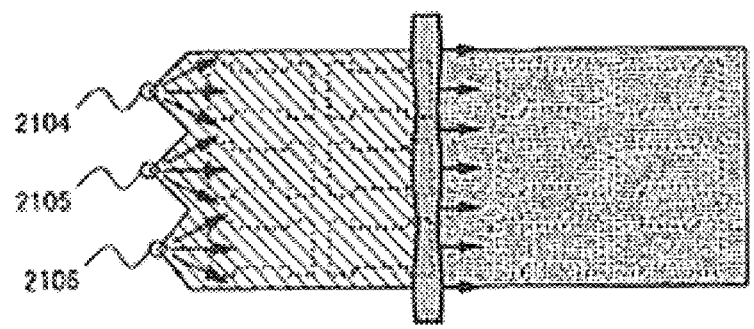
Figure 21C:
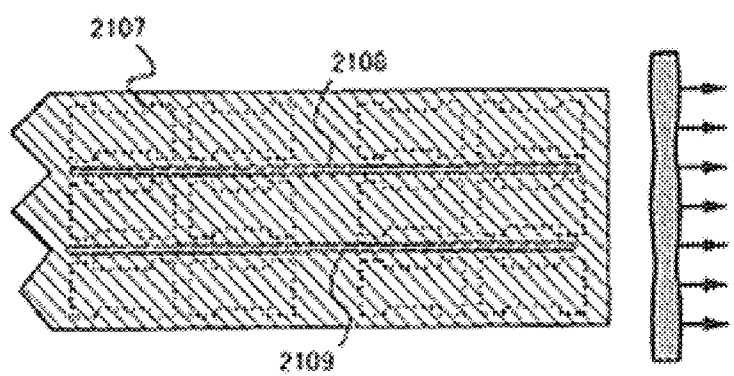
Figure 21D:
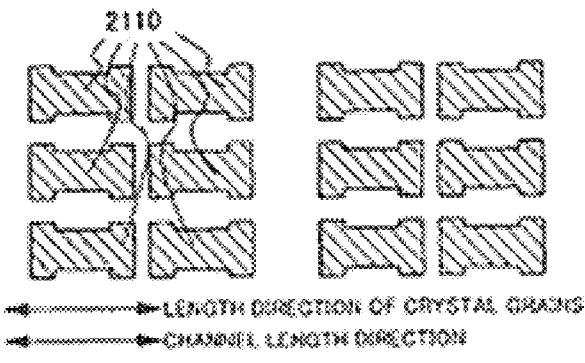

FIG. 20B shows an example of the relationship between the shape of a mask for patterning a semiconductor layer and portions irradiated with the laser light. Numeral 2001 denotes a laser light spot, and numeral 2004 denotes portions irradiated with the laser light. As shown in FIG. 20B, when scanning the portion where the first semiconductor island is not formed, the laser light is blocked by the AO modulator, and the laser light is therefore not irradiated onto the substrate. According to this embodiment, the laser light can be controlled not to be irradiated onto a portion that need not be crystallized; and even when the laser light has been irradiated thereonto, the energy density of the laser light can be controlled low. Therefore, this embodiment enables further reduction in the probability of causing damage occurring on the substrate due to irradiation of the laser light onto unnecessary portions.

[Embodiment 5]

In this embodiment, a process flow of steps in a semiconductor-device manufacturing method of the present invention will be described.

Figure 10:
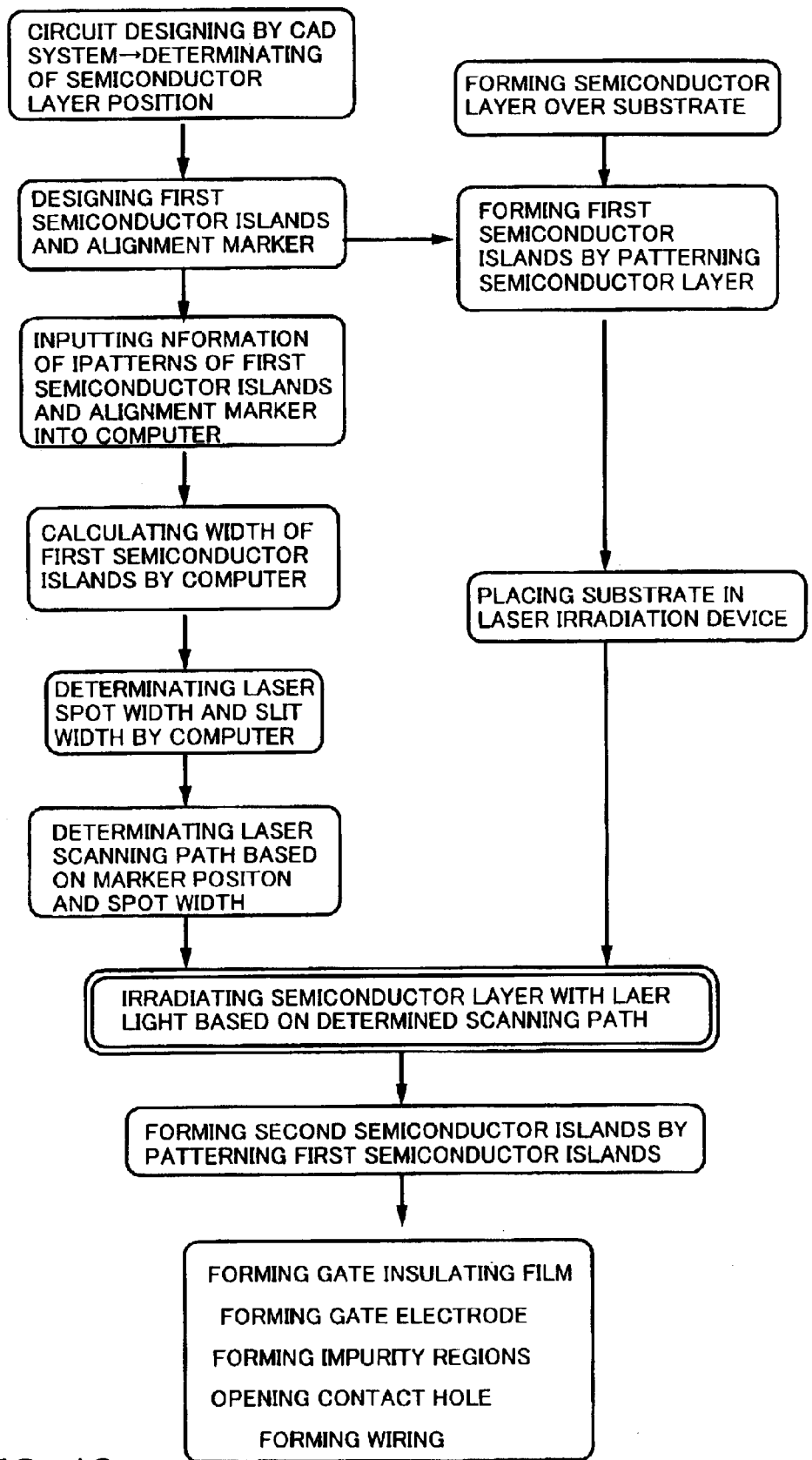
FIG. 10 is an example flow of steps including crystallization according to laser irradiation onto a semiconductor layer.

FIG. 10 shows a process flow of manufacturing steps. First, a CAD (computer aided design) system is used to design a circuit of a semiconductor device. When a circuit layout has been determined, that is, when TFT layout has been determined, the forming position of the each second semiconductor island is concurrently determined. In this case, the second semiconductor island, which is included in one first semiconductor island, is desirably determined to be positioned such that the charge movement direction in the channel-formed region is either aligned parallel to the scanning direction of the laser light or is aligned along an equivalent direction. However, the direction may not intentionally be aligned depending on the usage.

In addition, in the above step, a mask of the first semiconductor island may be designed so that an alignment marker is formed together with the first semiconductor island.

Subsequently, information regarding the pattern of the mask (pattern information) of the designed first semiconductor island is entered into the computer included in the laser irradiation device. According to the entered pattern information of the first semiconductor islands, the computer calculates the width of the each first semiconductor island in the vertical direction with respect to the scanning direction. Then, the width of the slit in the vertical direction with respect to the scanning direction is set according to the width of the each first semiconductor island.

Subsequently, according to the slit width, a scanning path of the laser light is determined based on the marker position as a reference.

On the other hand, films are deposited on the semiconductor substrate, the mask of the first semiconductor islands is used to pattern the semiconductor layer, and the first semiconductor islands are then formed. Subsequently, the substrate on which the first semiconductor islands are formed is set to the stage of the laser irradiation device.

Subsequently, using the marker as a reference, the laser light is irradiated along the determined scanning path, and crystallization is performed targeting the first semiconductor island.

After the laser light has been irradiated, patterning is performed for the first semiconductor island enhanced in the crystallinity according to the laser-light irradiation, and second semiconductor islands are then formed. Thereafter, steps of manufacturing a TFT from the second semiconductor island are performed. In specific, TFT-manufacturing steps are variable depending on the shape of the TFT. Representatively, however, a gate insulation film is deposited, and an impurity region is formed in the second semiconductor island. Subsequently, an interlayer insulation film is formed in such a manner as to cover the gate insulation film and a gate electrode, and contact holes are formed through the interlayer insulation film, and the impurity region is partly exposed. Then, wirings are formed on the interlayer insulation film to be in contact with the impurity region through the contact holes.

Next, a description will be given regarding an example procedure of performing alignment of the substrate and the mask by using the CCD camera, without forming an alignment marker.

Figure 11:
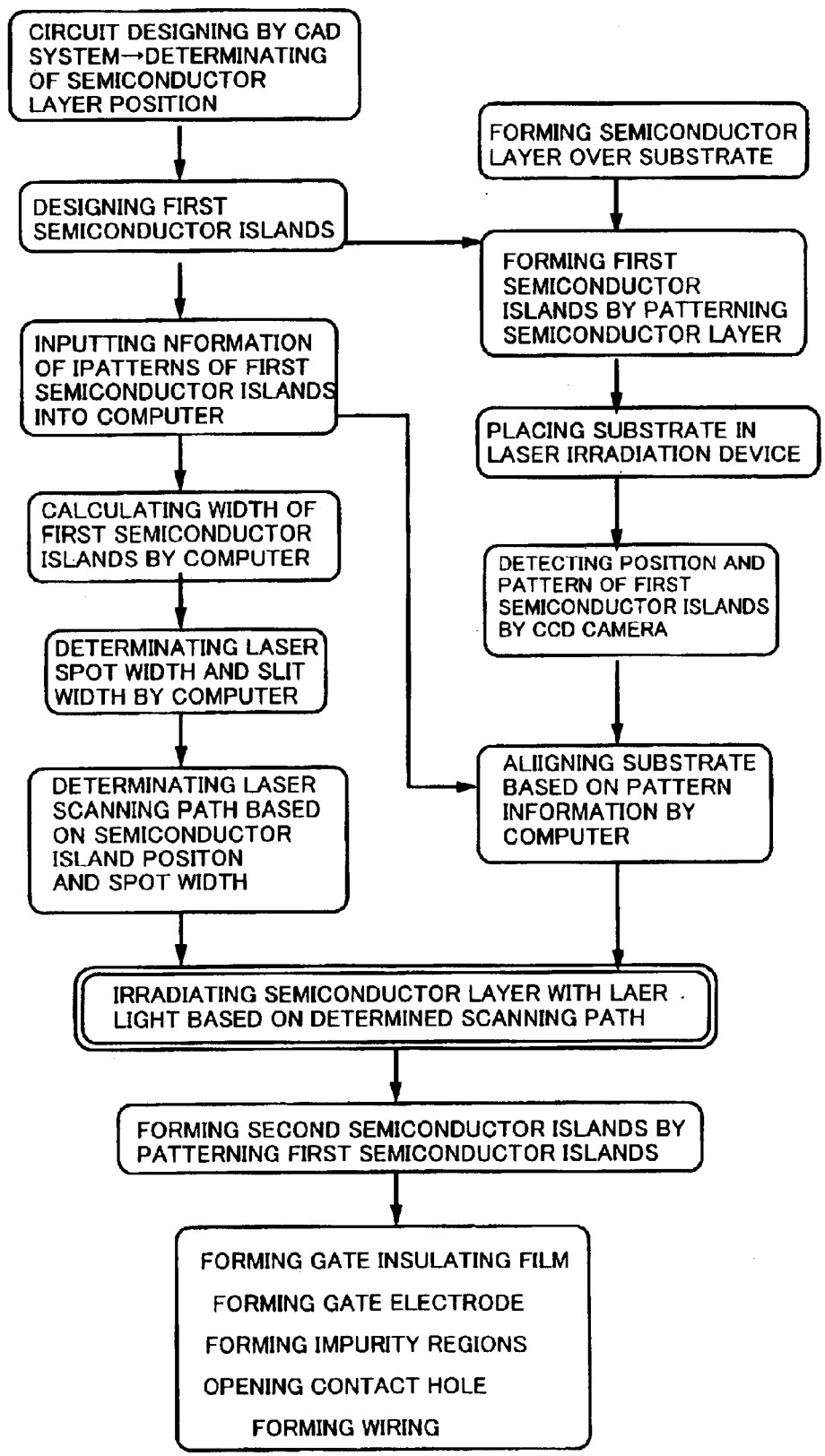
FIG. 11 is an example flow of steps including crystallization according to laser irradiation onto a semiconductor layer.

FIG. 11 shows a process flow of manufacturing steps. First, similar to the case of FIG. 10, a CAD system is used to design a circuit of a semiconductor device. When a circuit layout has been determined, that is, when TFT layout has been determined, the forming position of the each second semiconductor island is concurrently determined. In this case, the second semiconductor island, which is included in one first semiconductor island, is desirably determined to be positioned such that the charge movement direction in the channel-formed region is either aligned parallel to the scanning direction of the laser light or is aligned along an equivalent direction. However, the direction may not intentionally be aligned depending on the usage.

Subsequently, information regarding the pattern of the mask (pattern information) of the designed first semiconductor island is entered into the computer included in the laser irradiation device. According to the entered pattern information of the first semiconductor islands, the computer calculates the width of the each first semiconductor islands in the vertical direction with respect to the scanning direction. Then, the width of the slit in the vertical direction with respect to the scanning direction is set according to the width of the each first semiconductor island.

On the other hand, the semiconductor layers are deposited on the substrate, the mask of the first semiconductor islands is used to pattern the semiconductor layer, and the first semiconductor islands are then formed. Subsequently, the substrate on which the first semiconductor islands are formed is set to the stage of the laser irradiation device.

Subsequently, pattern information of the first semiconductor islands formed on the substrate set to the stage is detected by the CCD camera, and is then input as information to the computer. The computer compares two pieces of information. One of the two pieces of information is the pattern information of the first semiconductor island designed by the CAD system; and the other is the CCD-camera-obtained pattern information of the first semiconductor island actually formed on the substrate. As a result, the substrate and the mask are aligned with each other.

Subsequently, a scanning path of the laser light is determined according to the slit width and the CCD-camera-obtained position information of the first semiconductor island.

Then, the laser light is irradiated along the determined scanning path, and crystallization is performed targeting the first semiconductor island.

After the laser light has been irradiated, patterning is performed for the first semiconductor island enhanced in the crystallinity according to the laser-light irradiation, and second semiconductor islands are then formed. Thereafter, the steps of manufacturing a TFT from the second semiconductor island are performed. In specific, TFT-manufacturing procedure is variable depending on the shape of the TFT. Representatively, however, a gate insulation film is deposited, and an impurity region is formed in the second semiconductor island. Subsequently, an interlayer insulation film is formed in such a manner as to cover the gate insulation film and a gate electrode, and contact holes are formed through the interlayer insulation film, and the impurity region is partly exposed. Then, wirings are formed on the interlayer insulation film to be in contact with the impurity region through the contact holes.

Next, an example method according to which laser-light irradiation is performed multiple times will be described. As an example, a description will be made with reference to a method of performing second-time laser irradiation by changing the direction after laser irradiation has been performed one time.

Figure 12:
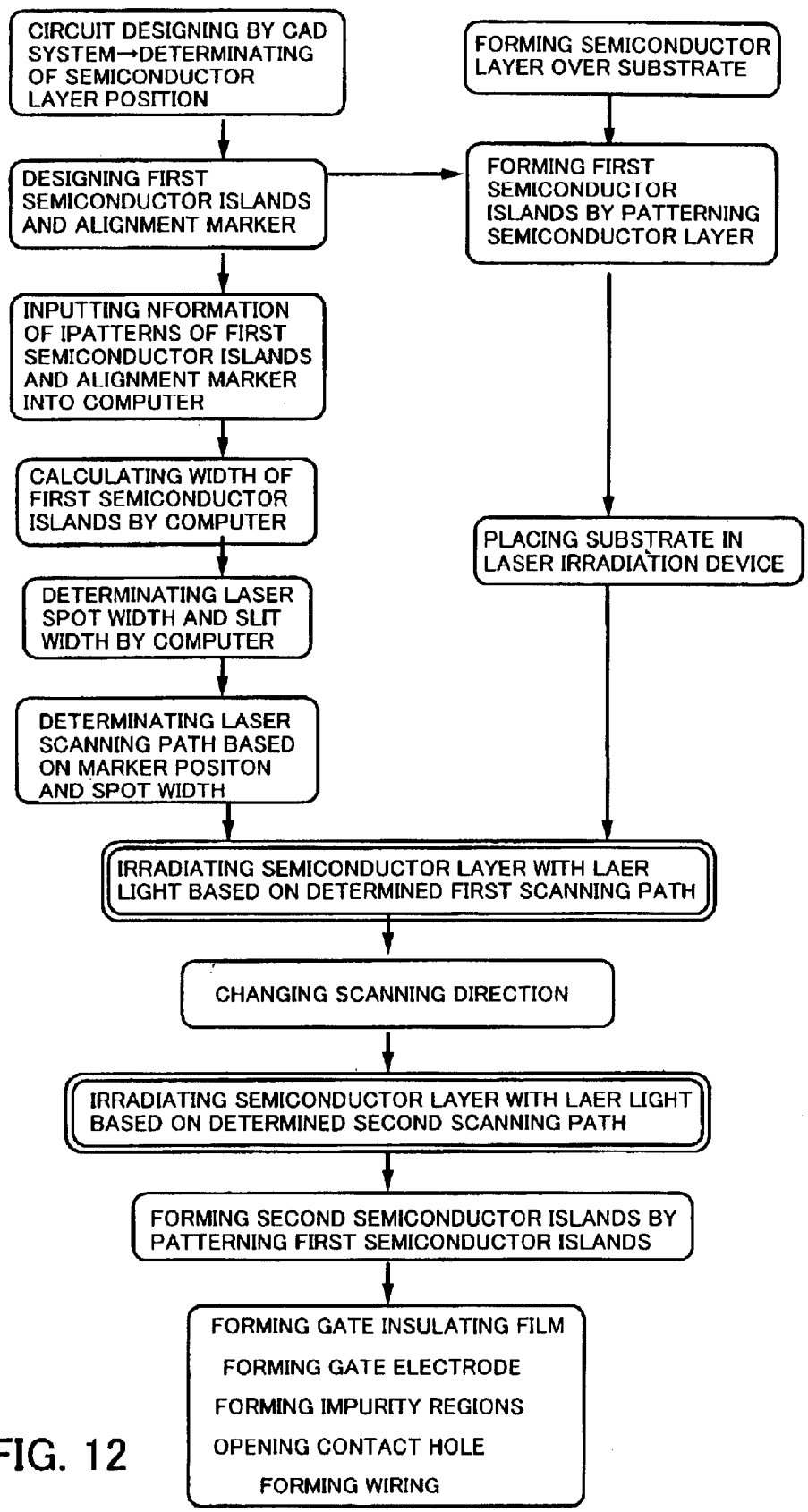
FIG. 12 is an example flow of steps including crystallization according to laser irradiation onto a semiconductor layer.

FIG. 12 shows a process flow of manufacturing steps. First, a CAD system is used to design a circuit of a semiconductor device. When a circuit layout has been determined, that is, when TFT layout has been determined, the forming position of each second semiconductor island is concurrently determined. In this case, the second semiconductor island, which is included in one first semiconductor island, is desirably determined to be positioned such that the charge movement direction in the channel-formed region is either aligned parallel to the scanning direction of the laser light or is aligned along an equivalent direction. However, the direction may not intentionally be aligned depending on the usage.

Subsequently, information regarding the pattern of the mask (pattern information) of the designed first semiconductor island is entered into the computer included in the laser irradiation device. According to the entered pattern information of the first semiconductor islands, the computer calculates two widths of the each first semiconductor island in the vertical direction with respect to each of the two scanning directions. Then, the widths of the slit in the vertical direction with respect to each of the two scanning directions are set according to the widths of the each first semiconductor island.

Subsequently, based on the determined slit widths, scanning paths of the laser light are determined in the individual two scanning directions according to the marker position as a reference.

On the other hand, the mask of the first semiconductor islands is used to pattern the semiconductor layer, and the first semiconductor islands are then formed. Subsequently, the substrate on which the first semiconductor islands are formed is set to the stage of the laser irradiation device.

Subsequently, using the marker as a reference, first laser light is irradiated along the first one of the two scanning paths that have been determined, and crystallization is performed targeting the first semiconductor island.

Subsequently, after changing the scanning direction, second laser light is irradiated along the second scanning path, and crystallization is performed targeting the first semiconductor island.

The angles of the scanning directions of the first laser light and second laser light may either be pre-stored in a memory or the like or manually be entered each time.

FIG. 12 shows an example method according to which the laser light is irradiated two times to the same first semiconductor island, as described above. However, with an AO modulator or the like being used, the scanning direction can be changed by specifying positions according to, for example, a method as described hereunder. As an example, a case is assumed such that the scanning direction in a signal line driver circuit is set different from the scanning direction in a pixel portion and a scan line driver circuit. In this case, when an AO modulator is used to irradiate laser light to a position where the signal line driver circuit is formed, the laser light can be controlled using the AO modulator not to be irradiated onto positions where the pixel portion and scan line driver circuit are formed. Similarly, when an AO modulator is used to irradiate laser light onto a position where the pixel portion and a scan line driver circuit are formed, the laser light can be controlled using the AO modulator not to be irradiated onto a position where the signal line driver circuit is formed. In this case, the AO modulator is controlled by the computer to operate in synchronization with position control means.

After the laser light has been irradiated, patterning is performed for the first semiconductor island enhanced in the crystallinity according to the laser-light irradiation, and second semiconductor islands are then formed. Thereafter, steps of manufacturing a TFT from the second semiconductor island are performed. In specific, TFT-manufacturing steps are variable depending on the shape of the TFT. Representatively, however, a gate insulation film is deposited, and an impurity region is formed in the second semiconductor island. Subsequently, an interlayer insulation film is formed in such a manner as to cover the gate insulation film and a gate electrode, and contact holes are formed through the interlayer insulation film, and the impurity region is partly exposed. Then, wirings are formed on the interlayer insulation film to be in contact with the impurity region through the contact holes.

Figure 13:
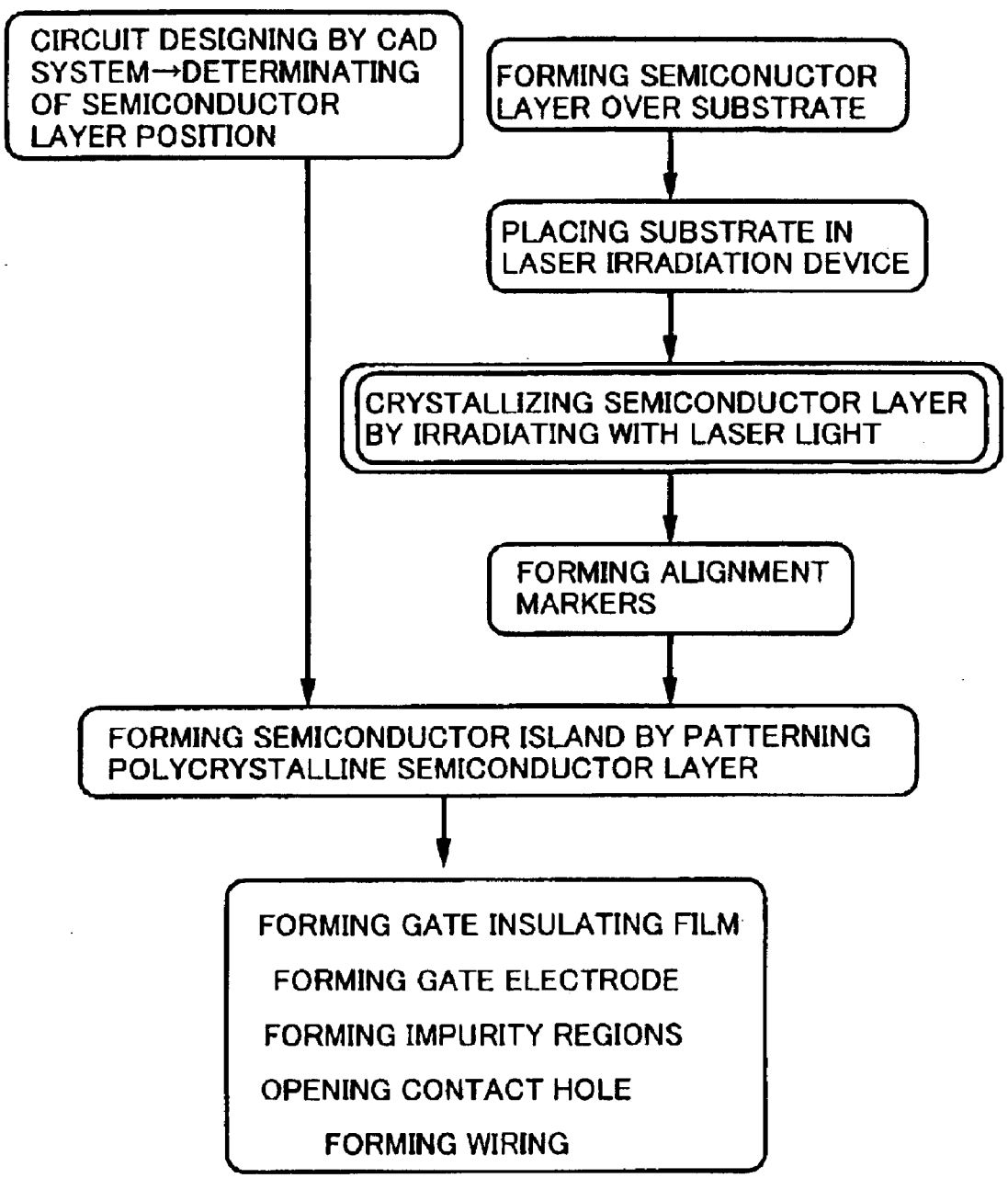
FIG. 13 is an example flow of steps including crystallization according to laser irradiation onto a semiconductor layer.

For comparison, FIG. 13 shows a process flow of manufacturing steps for a conventional semiconductor layers. As shown in FIG. 13, a CAD system is used to design a mask of a semiconductor device. On the other hand, an amorphous semiconductor layer is deposited on the substrate, and a substrate on which the amorphous semiconductor layer is formed is set to the laser irradiation device. Subsequently, scanning is performed so that laser light is irradiated onto the entire surface of the amorphous semiconductor layer, and the amorphous semiconductor layer is thus crystallized. Then, an alignment marker is formed on a polycrystalline semiconductor layer thus obtained through crystallization, and the polycrystalline semiconductor layer is patterned using the alignment marker as a reference. In this manner, second semiconductor islands are formed. Subsequently, TFTs are formed using the second semiconductor islands.

As described above, dissimilar to the conventional case shown in FIG. 13, according to the present invention, the alignment marker is formed using the laser light before the amorphous semiconductor layer is crystallized. Thereafter, the laser light is scanned according to the information of the mask for patterning the semiconductor layers.

According to the configuration described above, there can be reduced a time for irradiating the laser light to portions that are to be excluded by pattering among the semiconductor layers on the substrate. Consequently, the time for laser-light irradiation can be reduced, and in addition, the substrate-processing speed can be improved.

The method may include a step of crystallizing the semiconductor film by using a catalyst prior to the step of crystallization using the laser light. When using a catalytic element, a technique disclosed in either JP 07-130652 A and/or JP 08-78329 A is desirably employed.

The method including the step of crystallizing the semiconductor layer by using a catalyst includes a step of performing Ni-using crystallization (NiSPC) after deposition of an amorphous semiconductor layer. For example, when employing the technique disclosed in JP 07-130652 A, a nickel-containing layer is formed by coating an amorphous semiconductor layer with a nickel acetate solution containing nickel 10 ppm by weight. The nickel-containing layer is subjected to a step of dehydrogenation at 500° C. for one hour, and is then subjected to heat treatment at 500 to 650° C. for 4 to 12 hours (for example, at 550° C. for 8hours). In this case, in addition to nickel (Ni), usable catalytic elements include germanium (Ge), ferrous (Fe), palladium (Pd), tin (Sn), lead (Pb), cobalt (Co), platinum (Pt), copper (Cu), and gold (Au).

The crystallinity of the semiconductor layer crystallized according to the NiSPC is further enhanced through laser-light irradiation. Since a polycrystalline semiconductor layer obtained through the laser-light irradiation contains the catalytic element, the layer is subjected to a step (gettering step) of removing the catalytic element therefrom after the laser irradiation. The gettering step may be performed using a technique disclosed in JP 10-135468 A or JP 10-135469 A.

In specific, the aforementioned technique is employed in a manner described hereunder. Phosphorous is partly added to the polycrystalline semiconductor layer obtained after the laser-light irradiation, and heat treatment is performed therefor at 500 to 800° C. for 5 to 24 hours (for example, at 600° C. for 12 hours) in a nitrogen atmosphere. As a result, a phosphorous-added region of the polycrystalline semiconductor layer works as a gettering site, thereby enabling phosphorous existing in the polycrystalline semiconductor layer to segregate to the gettering site. Thereafter, the phosphorous-added region of the polycrystalline semiconductor layer is removed by patterning. Consequently, the processes as described above enables the production of a second semiconductor islands that have a catalytic-element concentration reduced below $1 \times 10^{17}$ atms/cm$^3$ (preferably, to a level of $1 \times 10^{16}$ atms/cm$^3$).

[Embodiment 6]

In this embodiment, circuit layouts on substrates, CW laser irradiation directions, and the like will be described with reference to some examples.

Figure 14A:
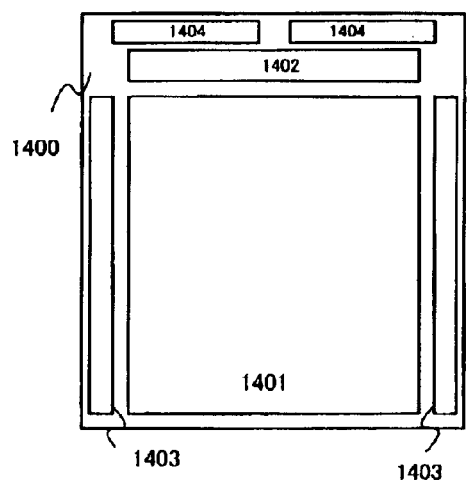
FIGS. 14A to 14E are explanatory views of an example of laser-light scanning directions on substrates.

Generally, a display device is configured as an example shown in FIG. 14A. The general example display device is configured to include a pixel portion 1401 in a central portion of a substrate 1400; a source single line driver circuit 1402 in an upper or lower portion of the pixel portion 1401; and a gate signal line driver circuit 1403 in any one of left and right portions of the pixel portion 1401 or in both of the left and right portions of the pixel portion 1401. A signal and power for driving the each driver circuit is input via a flexible print circuit (FPC) 1404 from the outside of the substrate.

Figure 14B:
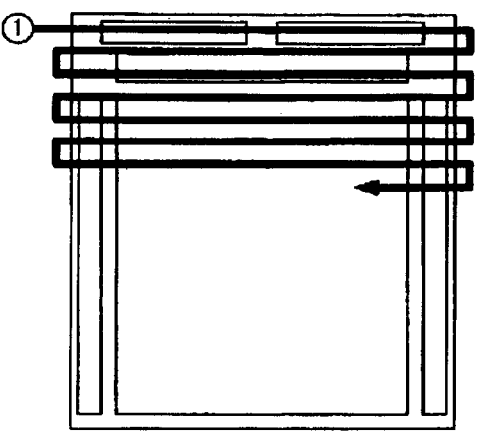

As shown in FIG. 14A, the source single line driver circuit 1402 is disposed extending in a pixel-column direction, and the gate signal line driver circuit 1403 is disposed extending in a pixel-line direction. Therefore, in a case where CW laser irradiation is performed as described in the embodiment mode, when the irradiation direction is aligned along the disposition direction of the source single line driver circuit 1402, as shown in FIG. 14B, the irradiation direction of the CW laser is not aligned to the disposition direction of the gate signal line driver circuit 1403. Generally, however, in comparison to a source signal line driver circuit for which high-speed driving is required, the driving frequency of a gate signal line driver circuit may be about one-several hundreds. Accordingly, even if active layers of TFTs constituting the gate signal line driver circuit are formed to include portions of microcrystalline semiconductor layers, it can be said that no problems would occur with the circuit operation.

Figure 14C:
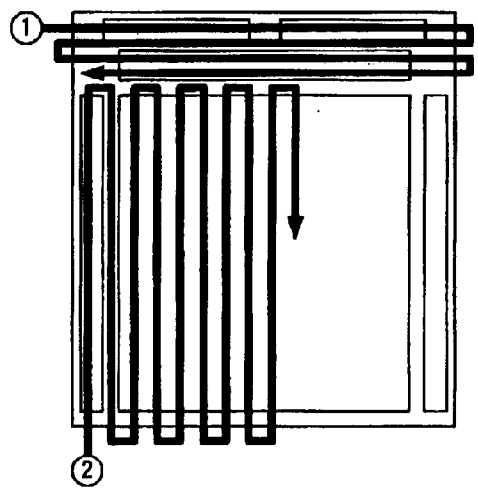

FIG. 14C illustrates another usable method in which the scanning direction is shifted during laser irradiation. Specifically, according to the method, first laser scanning is first performed in alignment with the source signal line driver circuit. Then, a stage on which the substrate is fixed is rotated 90 degrees, the laser scanning direction is thus changed, and second CW laser irradiation is then performed in alignment to the gate signal line driver circuit and the pixel portion.

Figure 14D:
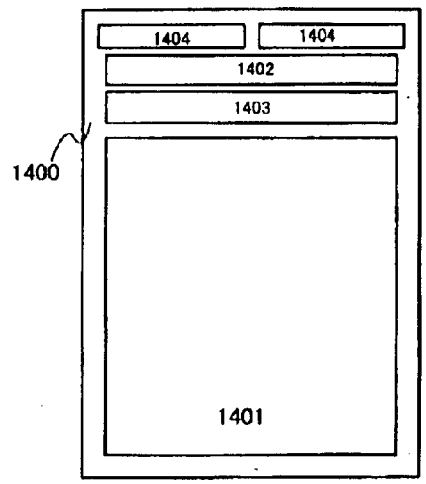
Figure 14E:
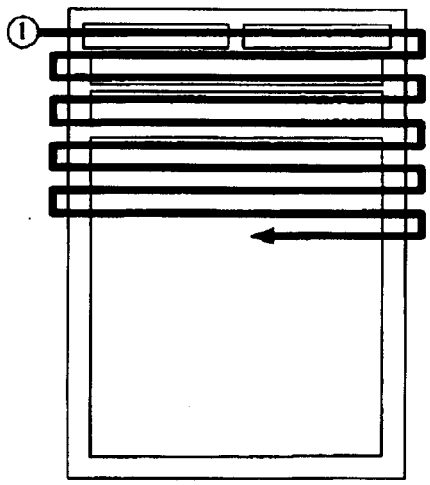

FIG. 14D illustrates still another usable method using a technique disclosed in Japanese Patent Application No. 2001-241463. In this case, a source single line driver circuit 1402 and a gate signal line driver circuit 1403 are either disposed on one side of a pixel portion or are disposed parallel to each other on the opposing two sides of the pixel portion. As a result, as shown in FIG. 14E, crystallization can be completed by one-time CW laser irradiation; and concurrently, the pixel portion and a semiconductor layer in a driver circuit can be configured only by unidirectional laser-light irradiation.

The above methods in this embodiment have been described only by way of examples, and various other methods may be employed. For example, a method may be used in which only a driver circuit portion for which high-speed driving is required is crystallized by the laser-light irradiation, and a pixel portion and the like for which the requirement level for high-speed driving is relatively low are manufactured using a conventional crystallization method. Meanwhile, this embodiment may be implemented in combination with other embodiments.

[Embodiment 7]

In this embodiment, a method of manufacturing an active matrix substrate will be described with reference to FIGS. 15 and 16. A substrate on which a CMOS circuit, a driver circuit, and a pixel portion having a pixel TFT and a holding capacity are formed together is called active matrix substrate for convenience.

First of all, a substrate 5001 formed of glass such as barium borosilicate glass and aluminum borosilicate glass is used in this embodiment. The substrate 5001 may be a quartz substrate, a silicon substrate, a metal substrate or stainless substrate, which has an insulating film on the surface. The substrate 5001 may be a plastic substrate having heat resistance, which withstands a processing temperature in this embodiment.

Next, a base film 5002 having an insulating film such as silicon oxide film, silicon nitride film, and a silicon oxynitride film is formed on the substrate 5001 by publicly known method (such as the sputtering method, LPCVD method and plasma CVD method). In this embodiment, a two-layer structure composing base films 5002a and 5002b is used for the base film 5002. However, a structure may be used where a single layer film, which is the insulating film itself, or at least two layers are stacked.

Figure 15A:
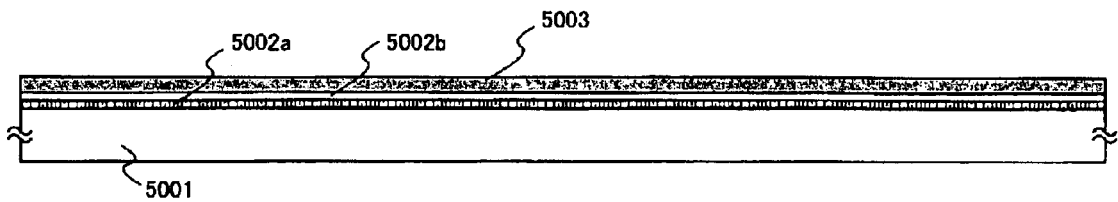
FIGS. 15A to 15F are explanatory views of manufacturing steps for a semiconductor device.

Next, semiconductor layer 5003 is formed on the base film 5002. First of all, semiconductor layer 5003 is formed with a thickness of 25 to 80 nm (preferably 30 to 60 nm) by publicly known method (such as the sputtering method, LPCVD method and plasma CVD method). The semiconductor film may be an amorphous semiconductor film, a fine crystal semiconductor film or a crystalline semiconductor film. Alternatively, the semiconductor film may be a compound semiconductor film having an amorphous structure such as an amorphous silicon germanium film (FIG. 15A).

Figure 15B:
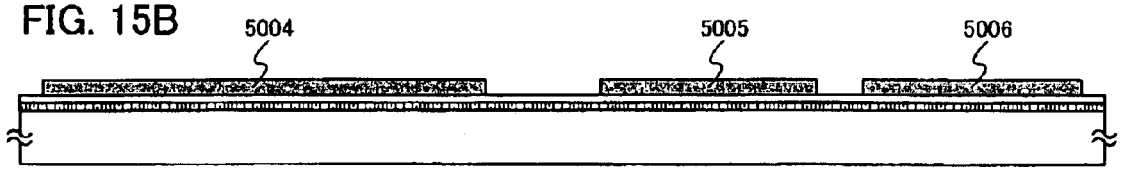

The semiconductor layer 5003 is patterned. And the first semiconductor islands 5004 to 5006 are formed by the anisotropic etching (the first etching treatment) is conducted in an atmosphere containing halogen fluoride, for example, ClF, ClF$_3$, BrF, BrF$_3$, IF, IF$_3$, and the like (FIG. 15B).

Then, the first semiconductor islands 5004 to 5006 are crystallized by laser crystallization method. In the case that the semiconductor layer is a micro crystal semiconductor layer or crystalline semiconductor layer, the island semiconductor layers are enhanced its crystallinity by conducting this step. The laser crystallization method is conducted by using the laser irradiation method described in Embodiment Mode and Embodiments 1 to 6. Specifically, the first semiconductor islands 5004 to 5006 are selectively subjected to laser light 5007 according to the mask information inputted to a computer of the laser irradiation apparatus. Of course, in addition to the laser crystallization method, the semiconductor layer may be crystallized by combining other publicly known crystallization method (such as thermal crystallization method using RTA or a furnace annealing and thermal crystallization method using a metal element facilitating the crystallization).

When a crystallization of a semiconductor layer is conducted, it is preferable that the second harmonic through the fourth harmonic of basic waves is applied by using the solid state laser which is capable of continuous oscillation in order to obtain a crystal in large grain size. Typically, it is preferable that the second harmonic (with a wavelength of 532 nm) or the third harmonic (with a wavelength of 355 nm) of an Nd:YVO$_4$ laser (basic wave of 1064 nm) is applied. Specifically, laser beams emitted from the continuous oscillation type YVO$_4$ laser with 10 W output is converted into a harmonic by using the non-linear optical elements. Also, a method of emitting a harmonic by applying crystal of YVO$_4$ and the non-linear optical elements into a resonator. Then, more preferably, the laser beams are formed so as to have a rectangular shape or an elliptical shape by an optical system, thereby irradiating a substance to be treated. At this time, the energy density of approximately 0.01 to 100 MW/cm$^2$ (preferably 0.1 to 10 MW/cm$^2$) is required. The substrate 5001 on which semiconductor film is formed is moved at approximately 10 to 2000 cm/s rate relatively corresponding to the laser beams so as to irradiate the semiconductor film.

Note that, a gas laser or solid-state laser of continuous oscillation type or pulse oscillation type can be used. The gas laser such as an excimer laser, Ar laser, Kr laser and the solid-state laser such as YAG laser, YVO$_4$ laser, YLF laser, YAlO$_3$ laser, glass laser, ruby laser, alexandrite laser, Ti:sapphire laser can be used as the laser beam. Also, crystals such as YAG laser, YVO$_4$ laser, YLF laser, YAlO$_3$ laser wherein Cr, Nd, Er, Ho, Ce, Co, Ti, Yb or Tm is doped can be used as the solid-state laser. A basic wave of the lasers is different depending on the materials of doping, therefore a laser beam having a basic wave of approximately 1 $\mu$m is obtained. A harmonic corresponding to the basic wave can be obtained by the using non-linear optical elements.

Figure 15C:
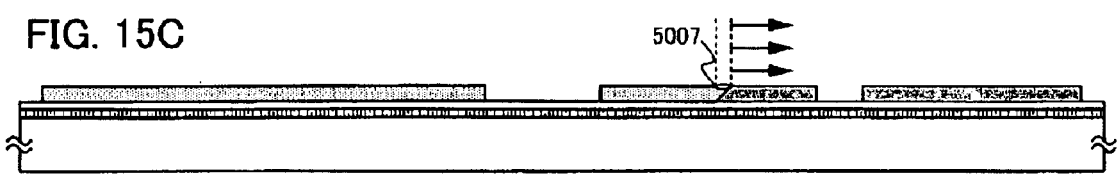

The first semiconductor islands 5004 to 5006 are subjected to laser light and enhanced the crystallinity by the above mentioned laser crystallization (FIG. 15C).

Figure 15D:
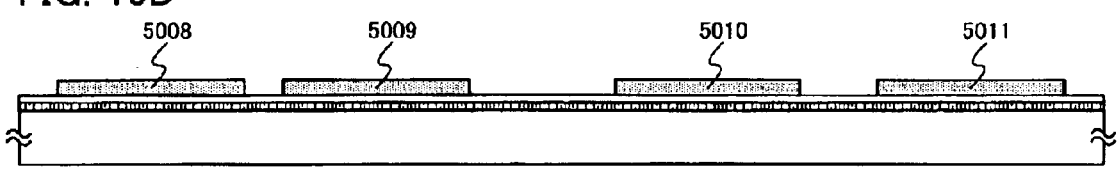

The second semiconductor islands 5008 to 5011 are formed by conducting patterning (the second etching treatment) of the enhanced crystallized first semiconductor islands 5004 to 5006 into a desired shape (FIG. 15D).

After the second semiconductor islands 5008 to 5011 are formed, a small amount of impurity element (boron or phosphorus) may be doped in order to control a threshold value of the TFT.

Next, a gate insulating film 5012 covering the second semiconductor islands 5008 to 5011 is formed. The gate insulating film 5012 is formed by using an insulating film containing silicon with a thickness of 40 to 150 nm by using plasma CVD method or sputtering method. In this embodiment, a silicon oxynitride film (compositional ratio: Si=32%, O=59%, N=7% and H=2%) with a thickness of 110 nm is formed by the plasma CVD method. Notably, the gate insulating film is not limited to the silicon oxynitride film but an insulating film containing other silicon may be used as a single layer or as a laminated pad.

When a silicon oxide film is used, it is formed by mixing Tetraethyl Orthosilicate (TEOS) and O$_2$ by plasma CVD method, which is discharged under a condition with reaction pressure of 40 Pa, a substrate temperature of 300 to 400° C. and high frequency (13.56 MHz) power density of 0.5 to 0.8 W/cm$^2$. Thermal annealing at 400 to 500° C. thereafter can give good characteristics to the silicon oxide film formed in this way as a gate insulating film.

Next, a first conductive film 5013, which is 20 to 100 nm in thickness, and a second conductive film 5014, which is 100 to 400 nm in thickness, is stacked on the gate insulating film 5012. In this embodiment, the first conductive film 5013 formed by a TaN film with a thickness of 30 nm and the second conductive film 5014 formed by a W film with a thickness of 370 nm are stacked. The TaN film is formed by using Ta target to perform sputtering in an atmosphere containing nitrogen. The W film is formed by using W target to perform sputtering. Alternatively, it can be formed by thermal CVD method using tungsten hexafluoride (WF$_6$). In both cases, the use of the gate electrode needs low resistance. Therefore, the resistivity of the W film is desirably 20 $\mu\Omega$cm or less. The low resistance of the W film can be achieved by increasing the size of the crystal grains. However, when the W film contains a large amount of impurity element such as oxygen, the crystallization is inhibited, which raises the resistance. Accordingly, in this embodiment, the W film is formed by the sputtering method using high purity (purity of 99.9999%) W target and by taking the prevention of intrusion of impurity from a vapor phase during the film forming into special consideration. Thus, the resistivity of 9 to 20 $\mu\Omega$cm can be achieved.

While, in this embodiment, the first conductive layer 5013 is TaN and the second conductive layer 5014 is W, they are not limited in particular. Both of them can be formed by an element selected from Ta, W, Ti, Mo, Al, Cu, Cr and Nd or an alloy material or a compound material mainly containing the element. Alternatively, a semiconductor film, such as a polycrystalline silicon film to which an impurity element such as phosphorus is doped, can be used. An AgPdCu alloy may be used. A combination of the first conductive film formed by a tantalum (Ta) film and the second conductive film formed by a W film, a combination of the first conductive film formed by a titan nitride (TiN) film and the second conductive film formed by a W film, a combination of the first conductive film formed by a tantalum nitride (TaN) film and the second conductive film formed by a W film, a combination of the first conductive film formed by a tantalum nitride (TaN) film and the second conductive film formed by an Al film, or a combination of the first conductive film formed by a tantalum nitride (TaN) film and the second conductive film formed by a Cu film is possible.

Further, the present invention is not limited to a two-layer structure. For example, a three-layer structure may be adopted in which a tungsten film, an alloy film of aluminum and silicon (Al—Si), and a titanium nitride film are sequentially laminated. Moreover, in case of a three-layer structure, tungsten nitride may be used in place of tungsten, an alloy film of aluminum and titanium (Al—Ti) may be used in place of the alloy film of aluminum and silicon (Al—Si), and a titanium film may be used in place of the titanium nitride film.

Figure 15E:
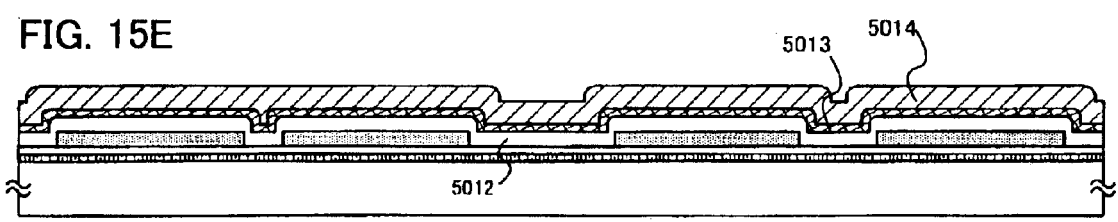

Note that, it is important that appropriate etching method or kinds of etchant is properly selected depending on the materials of a conductive film (FIG. 15E).

Figure 15F:
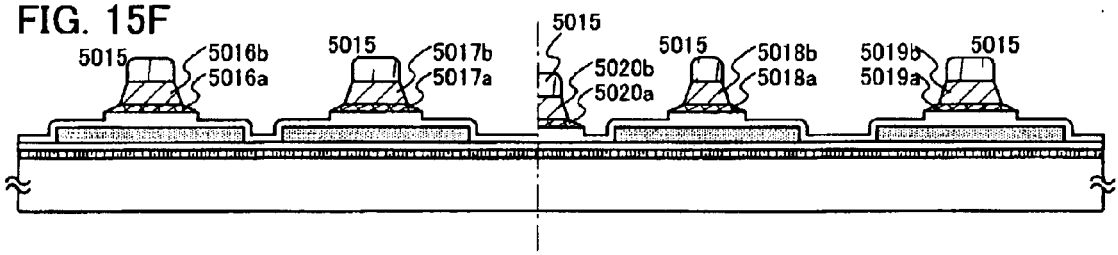

Next, mask 5015 made of resist using photolithography method are formed, and third etching processing is performed thereon in order to form electrodes and wires. The third etching processing is performed under first and second etching conditions (FIG. 15F). The first etching condition in this embodiment is to use Inductively Coupled Plasma (ICP) etching and to use CF$_4$ and Cl$_2$ and O$_2$ as an etching gas, whose amount of gases are 25/25/10 (sccm), respectively. 500 W of RF (13.56 MHz) power was supplied to a coil type electrode by 1 Pa pressure in order to generate plasma and then to perform etching. 150 W of RF (13.56 MHz) power was also supplied to a substrate side (test sample stage) and substantially negative self-bias voltage was applied. The W film was etched under the first etching condition so as to obtain the end of the first conductive layer in a tapered form.

After that, the first etching condition is shifted to the second etching condition without removing the mask 5015 made of resist. Then, $CF_4$ and $Cl_2$ are used as etching gases. The ratio of the amounts of flowing gasses is 30/30 (sccm). 500 W of RF (13.56 MHz) power is supplied to a coil type electrode by 1 Pa pressure in order to generate plasma and then to perform etching for amount 30 seconds. 20 W of RF (13.56 MHz) power is also supplied to a substrate side (test sample stage) and substantially negative self-bias voltage is applied. Under the second etching condition where $CF_4$ and $Cl_2$ are mixed, both W film and TaN film were etched to the same degree. In order to etch without leaving a residue on the gate insulating film, the etching time may be increased 10 to 20% more.

In the third etching processing, when the shape of the mask made of resist is appropriate, the shape of the ends of the first and the second conductive layers are in the tapered form due to the effect of the bias voltage applied to the substrate side. The angle of the tapered portion is 15 to 45°. Thus, conductive layers 5016 to 5020 in a first form are formed which include the first conductive layers and the second conductive layers (first conductive layers 5016a to 5020a and second conductive layer 5016b to 5020b) through the first etching processing. In a gate insulating film 5012, an area not covered by the conductive layers 5016 to 5020 in the first form is etched by about 20 to 50 nm so as to form a thinner area.

Figure 16A:
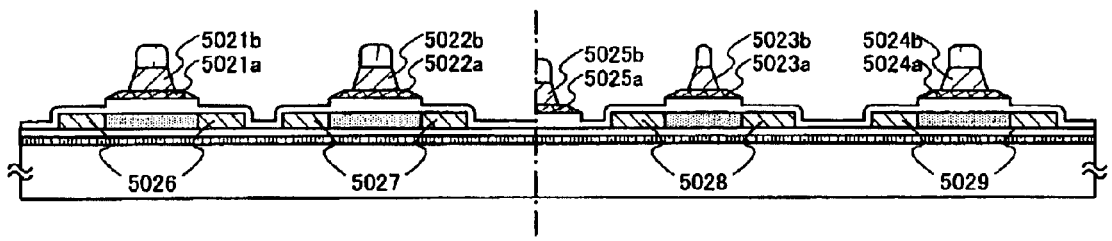
FIGS. 16A to 16E are explanatory views of manufacturing steps for a semiconductor device.
Figure 16B:
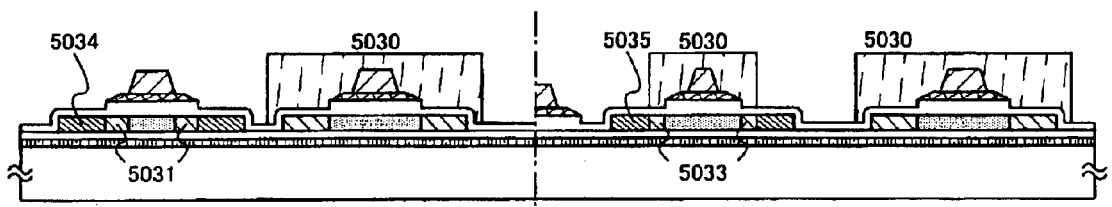

Next, fourth etching processing is performed without removing mask 5015 made of resist (FIG. 16A). Here, $CF_4$, $Cl_2$ and $O_2$ are used as an etching gas to etch the W film selectively. Then, second conductive layers 5021b to 5025b are formed by the second etching processing. On the other hand, the first conductive layers 5016a to 5020a are not etched very much, and conductive layers 5021 to 5025 (first conductive layers 5021a to 5025a and second conductive layer 5021b to 5025b) in the second form are formed.

First doping processing is performed without removing mask 5015 made of resist and low density of impurity element, which gives n-type to the second semiconductor island, is added. The doping processing may be performed by the ion-doping method or the ion-implanting method. The ion doping method is performed under a condition in the dose of $1 \times 10^{13}$ to $5 \times 10^{14}$ atoms/cm$^2$ and the accelerating voltage of 40 to 80 kV. In this embodiment, the ion doping method is performed under a condition in the dose of $1.5 \times 10^{13}$ atoms/cm$^2$ and the accelerating voltage of 60 kV. The n-type doping impurity element may be Group 15 elements, typically phosphorus (P) or arsenic (As). Here, phosphorus (P) is used. In this case, the conductive layers 5021 to 5025 function as masks for the n-type doping impurity element. Therefore, impurity areas 5026 to 5029 are formed in the self-alignment manner. An n-type doping impurity element in the density range of $1 \times 10^{18}$ to $1 \times 10^{20}$ atoms/cm$^3$ are added to the impurity areas 5026 to 5029.

When mask 5015 made of resist are removed, new mask 5030 made of resist are formed. Then, second doping processing is performed by using higher accelerating voltage than that used in the first doping processing. The ion doping method is performed under a condition in the dose of $1 \times 10^{13}$ to $1 \times 10^{15}$ atoms/cm$^2$ and the accelerating voltage of 60 to 120 kV. In the doping processing, the second conductive layers 5021b to 5025b are used as masks against the impurity element. Doping is performed such that the impurity element can be added to the semiconductor layer at the bottom of the tapered portion of the first conductive layer. Then, third doping processing is performed by having lower accelerating voltage than that in the second doping processing to obtain a condition shown in FIG. 16B. The ion doping method is performed under a condition in the dose of $1 \times 10^{15}$ to $1 \times 10^{17}$ atoms/cm$^2$ and the accelerating voltage of 50 to 100 kV. Through the second doping processing and the third doping processing, an n-type doping impurity element in the density range of $1 \times 10^{18}$ to $5 \times 10^{19}$ atoms/cm$^3$ is added to the low density impurity areas 5031 and 5033, which overlap with the first conductive layer. An n-type doping impurity element in the density range of $1 \times 10^{19}$ to $5 \times 10^{21}$ atoms/cm$^3$ is added to the high density impurity areas 5034 to 5035.

With proper accelerating voltage, the low density impurity area and the high density impurity area can be formed by performing the second doping processing and the third doping processing once.

Figure 16C:
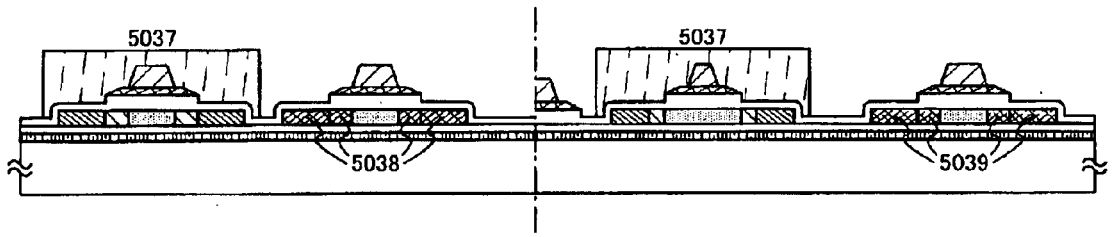

Next, after removing mask 5030 made of resist, new mask 5037 made of resist are formed to perform the fourth doping processing. Through the fourth doping processing, impurity areas 5038 and 5039, to which an impurity element doping a conductive type opposite to the one conductive type is added, in a semiconductor layer, which is an active layer of a p-channel type TFT. Second conductive layers 5021a to 5025a are used as mask against the impurity element, and the impurity element giving p-type is added so as to form impurity areas in the self-alignment manner. In this embodiment, the impurity areas 5038 and 5039 are formed by applying ion-doping method using diborane ($B_2H_6$) (FIG. 16C). During the fourth doping processing, the semiconductor layer forming the n-channel TFT is covered by mask 5037 made of resist. Thorough the first to the third doping processing, phosphorus of different densities is added to each of the impurity areas 5038 and 5039. Doping processing is performed such that the density of p-type doping impurity element can be $1 \times 10^{19}$ to $5 \times 10^{21}$ atoms/cm$^3$ in both areas. Thus, no problems are caused when they function as the source region and the drain region of the p-channel TFT.

Impurity areas are formed in the second semiconductor islands, respectively, through the processes above.

Next, the mask 5037 made of resist are removed and a first interlayer insulating film 5040 is formed thereon. The first interlayer insulating film 5040 may be an insulating film with a thickness of 100 to 200 nm containing silicon, which is formed by plasma CVD method or sputtering method. In this embodiment, silicon oxynitride film with a thickness of 150 nm is formed by plasma CVD method. The first interlayer insulating film 5040 is not limited to the silicon oxynitride film but may be the other insulating film containing silicon in a single layer or in a laminated pad.

Figure 16D:
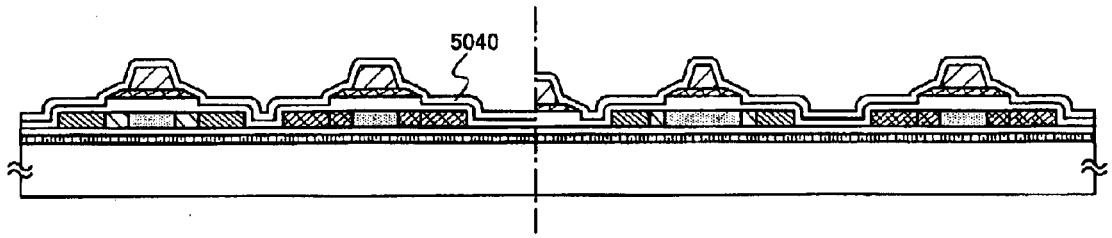

Next, as shown in FIG. 16D, activation processing is performed by using laser irradiation method. When a laser annealing method is used, the laser used in the crystallization can be used. When the activation processing is performed, the moving speed is same as the crystallization, and an energy density of about 0.01 to 100 MW/cm$^2$ (preferably, 0.01 to 10 MW/cm$^2$) is required. Also, a continuous oscillation laser may be used in the case the crystallization is performed and a pulse oscillation laser may be used in the case the activation is performed.

Also, the activation processing may be conducted before the first interlayer insulating film is formed.

After the heating processing (thermal processing at 300 to 550° C. for 1 to 12 hours) is performed, hydrogenation can be performed. This process terminates the dangling bond of the semiconductor layer with hydrogen contained in the first interlayer insulating film 5040. Alternatively, the hydrogenation may be plasma hydrogenation (using hydrogen excited by plasma) or heating processing in an atmosphere containing 3 to 100% of hydrogen at 300 to 650° C. for 1 to 12 hours. In this case, the semiconductor layer can be hydrogenated regardless of the existence of the first interlayer insulating film.

Next, a second interlayer insulating film 5041 formed by an inorganic insulating material or an organic insulator material is formed on the first interlayer insulating film 5040. In this embodiment, an acrylic resin film with a thickness of 1.6 μm is formed. Next, after the second interlayer insulating film 5041 is formed, the third interlayer insulating film 5042 is formed to contact with the second interlayer insulating film 5041.

Figure 16E:
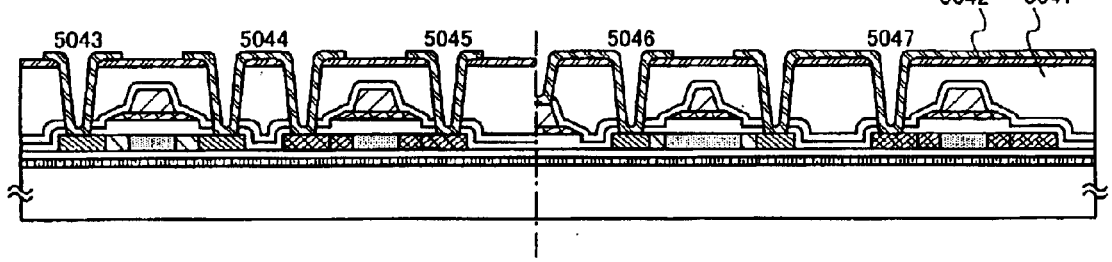

Wirings 5043 to 5047 are formed. These wirings are formed by patterning a film laminating a Ti film with a thickness of 50 nm and an alloy film (alloy film of Al and Ti) with a thickness of 500 nm. It is not limited to the two-layer structure but may be a one-layer structure or a laminate pad including three or more layers. The materials of the wirings are not limited to Al and Ti. For example, the wiring can be formed by forming Al or Cu on a TaN film and then by patterning the laminate film in which a Ti film is formed (FIG. 16E).

In this way, the driver circuit having a CMOS circuit including an n-channel TFT and a p-channel TFT, and the pixel portion having the pixel TFT and the storage capacitor can be formed on the same substrate. Thus, an active matrix substrate is completed.

Present invention can be implemented by combining with other embodiments.

[Embodiment 8]

This embodiment explains, below, a process to manufacture a reflection type liquid crystal display device from the active matrix substrate made in Embodiment 7, using FIGS. 16 and 17.

Figure 17:
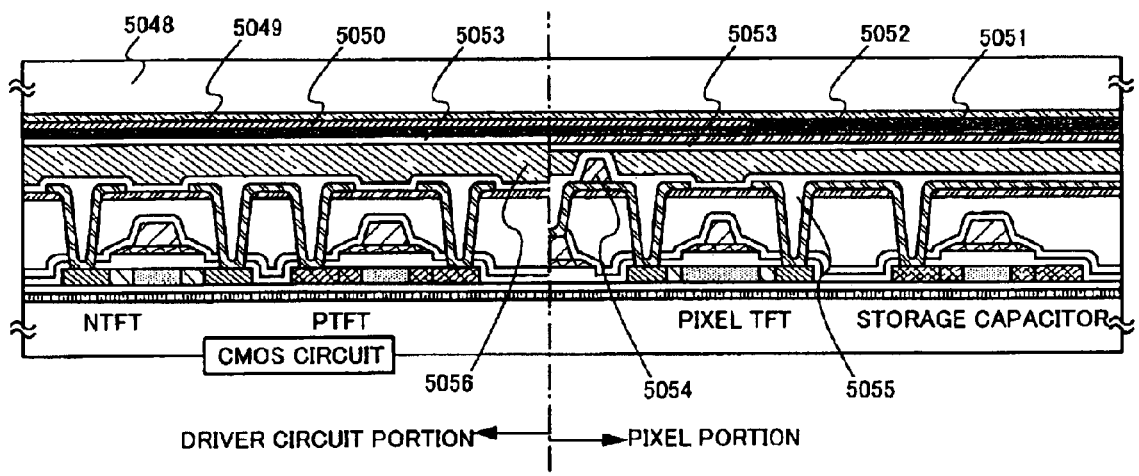
FIG. 17 is an explanatory view of manufacturing steps for a liquid crystal display device.

First, after obtaining an active matrix substrate in the state of FIG. 16E according to Embodiment 5, an orientation film 5055 is formed at least on the wiring (the pixel electrodes) 5047 on the active matrix substrate of FIG. 16E and subjected to a rubbing process (FIG. 17). Incidentally, in this embodiment, prior to forming an orientation film 5055, an organic resin film such as an acryl resin film is patterned to form columnar spacers 5054 in a desired position to support the substrates with spacing. Meanwhile, spherical spacers, in place of the columnar spacers, may be distributed over the entire surface of the substrate.

Then, a counter substrate 5048 is prepared. Then, coloring layers (coloring filters) 5049, 5050 (though only two coloring filters are shown here, actually three coloring filters; R, G, B may be used) and a planarizing film 5051 are formed on a counter substrate 5048. A shade portion is formed by overlapping a red coloring layer 5049 and a blue coloring layer 5050 together. Meanwhile, the shade portion may be formed by partly overlapping a red coloring layer and a green coloring layer.

Then, a counter electrode 5052 of a transparent conductive film is formed on the planarizing film 5051 at least in the pixel portion. An orientation film 5053 is formed over the entire surface of the counter substrate and subjected to a rubbing process.

Then, the active matrix substrate and the counter substrate are bonded together by a seal member (not shown). The seal member (not shown) is mixed with filler so that the filler and the columnar spacers bond together the two substrates through an even spacing. Thereafter, a liquid crystal material 5056 is poured between the substrates, and completely sealed by a sealant (not shown). The liquid crystal material 5056 may be a known liquid crystal material. In this manner, completed is a reflection type liquid crystal display device shown in FIG. 17. If necessary, the active matrix substrate or counter substrate is divided into a desired shape. Furthermore, a polarizing plate (not shown) is bonded only on the counter substrate. Then, an FPC is bonded by a known technique.

The liquid crystal display device manufactured as above comprises TFT manufactured by a semiconductor film, wherein a laser beam having a periodic or uniform energy distribution is irradiated and a crystal grain with a large grain size is formed. Thus, the liquid crystal display device ensures a good operational characteristic and high reliability. The liquid crystal display device can be used as a display portion for an electronic appliance in various kinds.

Incidentally, this embodiment can be implemented by combining with other embodiments.

[Embodiment 9]

Figure 18A:
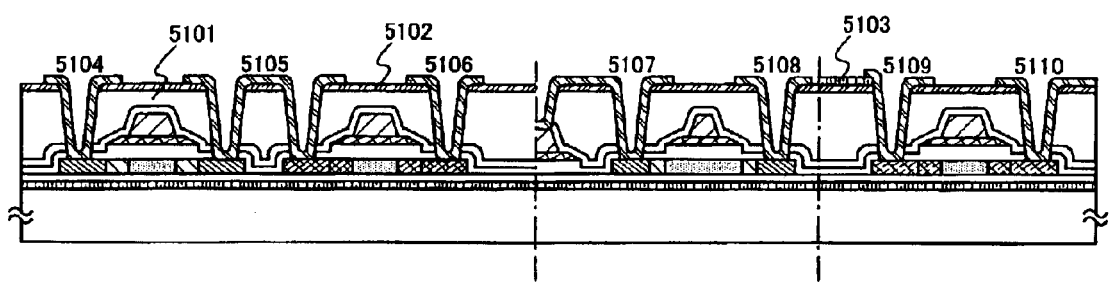
FIGS. 18A and 18B are explanatory views of manufacturing steps for a light emitting device.
Figure 18B:
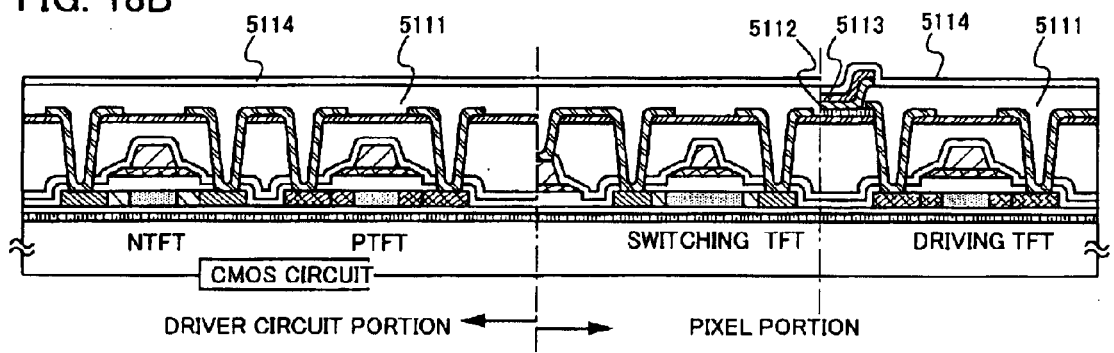

In this embodiment, an example of manufacturing method for a light emitting device will be described (FIGS. 18A and 18B). The manufacturing method uses an active matrix substrate manufactured using the manufacturing method for the active matrix substrate described in Embodiment 7. The "light emitting device" is a generic name of a display panel formed such that light-emitting elements formed on a substrate are hermetically enclosed into between the substrate and a cover material, and a display module in which TFTs and the like are mounted on the display panel. The light-emitting element includes a layer (light-emitting layer) containing an organic compound with which electroluminescence generated by an electric field being applied is obtained, an anode layer, and a cathode layer. The electroluminescence in the organic compound has two types: the one is luminescence (fluorescence) generated when the state returns from a singlet excited state to a normal state; and the other is luminescence (phosphorescence) generated when the state returns from a triplet excited state to a normal state. The organic compound of this embodiment includes either one of these two types or the two types.

In the present specification, all layers formed between the anode and the cathode in the light-emitting element are defined as EL layers. In specific, the EL layers include a light-emitting layer, a hole injection layer, an electron injection layer, a hole transporting layer, and an electron transporting layer. Basically, the light-emitting element has a structure in which an anode layer, a light-emitting layer, and a cathode layer are overlaid in that order. However, in addition to the structure, the light-emitting layer has a structure in which, for example, an anode layer, a hole injection layer, a light-emitting layer, and a cathode layer are overlaid in that order; or, for example, an anode layer, a hole injection layer, a light-emitting layer, an electron transporting layer, and a cathode layer are overlaid in that order.

After the formation of layers up to a third interlayer insulation film 5102 according to Embodiment 7, the pixel electrode working as the anode of the light-emitting element is formed of a transparent conductive film. To form the transparent conductive film, there can be used any one of a compound of indium oxide and stannic oxide, a compound of indium oxide and zinc oxide, zinc oxide, stannic oxide, and indium oxide. Alternatively, a transparent conductive film containing gallium may be used.

In the case of the light emitting device, the third interlayer insulation film 5102 is effective to prevent intrusion of moisture contained in the second interlayer insulation film 5101 into the organic light-emitting layer. When the second interlayer insulation film 5101 contains an organic resin material, since the organic resin material contains much moisture, the provision of the third interlayer insulation film 5102 is significantly effective. In addition, in this embodiment, it is very important to level stepped portions formed with TFTs by using the second interlayer insulation film 5101 formed of the resin. Since the light-emitting layer to be formed in a later step is very thin, defects in light emission can occur because of the existence of the steps. For this reason, the stepped portions are desirably leveled before the formation of the pixel electrode so that the light-emitting layer can be formed on a surface leveled as flat as possible.

The n-channel TFT and the p-channel TFT contained in the driver circuit are formed using the manufacturing method according to Embodiment 5. In this embodiment, while the TFTs have a single-gate structure, the TFTs may have a double-gate structure or a triple-gate structure.

Subsequently, a resin film formed of diffused materials, such as a black dye, carbon, and black pigment, is formed in such a manner as to cover the third interlayer insulation film 5102, an opening is formed in a portion to be a light emitting element and a shielding film (not shown) is thus formed. As the resin, representative examples include, for example, polyimide, polyamide, acrylic resin, and benzocyclopolybutene (BCB); however, the material is not limited thereto. A material other than the organic resin may also be used as a material of the shielding film, of which examples are materials made by mixing a black dye, carbon, or black pigment with silicon, silicon oxide, silicon oxynitride, or the like. The shielding film is effective to prevent outside light reflected on wirings 5104 to 5110 from being visible to the eye of a viewer. After the above-described processing, contact holes reaching the impurity regions are opened, and the wirings 5104 to 5110 are then formed (FIG. 18A).

Subsequently, a bank 5111 is formed of a resin material. The bank 5111 is formed such that an acrylic film or polyimide film having a thickness of 1 to 2 $\mu$m is patterned to allow a pixel electrode 5103 to partly be exposed.

An EL layer 5112 is formed over the pixel electrode 5103. While FIG. 18B shows only one pixel, EL layers are separately formed corresponding to the colors R (red), G (green), and B (blue) in this embodiment. In addition, in this embodiment, a low-molecular based organic light-emitting material is formed by an evaporation method. Specifically, the material is formed to be a multi-layered structure such that a 20-nm thick copper phthalocyanine (CuPc) film is provided as a hole injection layer, and a 70-nm thick tris-8-hydroxyquinolinato aluminum complex (Alq$_3$) film is formed thereon as a light-emitting layer. The luminescent color can be controlled by adding a fluorescent pigment, such as quinacridone, perylene, or DCM1, to Alq$_3$.

However, the above are simply example of organic light-emitting materials which can be used as the light-emitting film, and the present invention is not limited thereto in any way. The light-emitting layer (layer for causing light emission and a carrier thereof to move) may be formed by arbitrarily combining light-emitting layers and charge transporting films (or, charge injection layers). For example, while this embodiment has been described with reference to the example in which the low-molecular based organic light-emitting material is used as the light-emitting material, either intermediate-molecular based organic light-emitting material or a high-molecular based organic light-emitting material may be used. In this case, the intermediate-molecular based organic light-emitting material refers to an organic light-emitting material that does not have sublimation characteristics and that has 20 or fewer molecules or has a chained molecule length of 10 $\mu$m or smaller. As an example use of the high-molecular based organic light-emitting material, a multi-layered structure may be formed such that a 20-nm polythiophene (PEDOT) film is provided by spin coating as a hole injection film, and a polyphenylene vinylene (PPV) film of about 100 nm is provided thereon as a light-emitting film. Meanwhile, when $\pi$-conjugate based high molecules are used, light-emission wavelengths for a color range of from red to blue become selectable. Moreover, for example, an inorganic material such as silicon carbide may be used as a material of, for example, the charge transporting film or the charge injection layer. For these organic light-emitting materials and inorganic materials, known materials may be used.

Next, a pixel electrode 5113 is provided as a cathode on the EL layer 5112. In this embodiment, an aluminium-lithium alloy layer is used as the conductive film. As a matter of course, a known MgAg film (magnesium-silver alloy layer) may be used. For the material of the cathode, either a conductive film formed of elements belonging to Group 1 or 2 in the periodic table or a conductive film to which these materials are added may be used.

The light-emitting element is completed upon formation of the layers up to the pixel electrode 5113. In this case, the light-emitting element refers to an element formed of the pixel electrode 5103 (anode), the EL layer 5112, and the cathode 5113.

In addition, a protection film 5114 may be formed in such a manner as to fully cover the light-emitting element. The protection film 5114 is formed of an insulation film including a carbon layer, a silicon nitride film, or a silicon oxynitride film, in which the insulation film is used in the form of either a single layer or a combined multilayer.

In this case, a film having a good coverage is preferably used for the protection film 5114; specifically, using a carbon film, particularly, a DLC (diamond-like carbon) film is effective. Since the DLC film can be formed in a temperature range of from a room temperature to 100° C. or lower, the film can easily be formed also on an upper portion of the light-emitting layer 5112 having a low heat resistance. In addition, since the DLC film has a high blocking effect against oxygen, oxidization of the light-emitting layer 5112 can be suppressed. This enables possible oxidization of the light-emitting layer 5112 from occurring while a subsequent sealing step is being performed.

As described above, according to this embodiment, all the light-emitting layers 5112 are covered by the inorganic insulation film that has a high barrier property and that is formed of, for example, carbon, silicon nitride, silicon oxynitride, aluminium nitride, or aluminium oxynitride. Accordingly, the light-emitting layer can be prevented even more efficiently from being deteriorated due to entrance of moisture, oxygen, and the like.

In addition, when a silicon nitride film formed by a silicon-targeted sputtering method is used for the third interlayer insulation film 5102 and the protection film 5114, entrance of impurity into the light-emitting layer can be prevented even more efficiently. While film formation conditions may appropriately be selected, sputtering is preferably performed using a nitrogen (N$_2$) or nitrogen-argon mixture gas and applying a high frequency power. In this case, the substrate temperature may be maintained at a room temperature, and no heating means needs to be used. When an organic insulation film, an organic compound layer, or the like has already been formed, the film formation is desirably performed with the substrate not being heated. However, in order to completely remove absorbed or occluded moisture, dehydrogenation processing is preferably performed by heating the object for a period of several minutes to several hours at a temperature of 50 to 100° C. in a vacuumed condition.

It is known that when a silicon nitride film is formed according to a sputtering method performed in such a manner that silicon is targeted in a room temperature, a high frequency power of 13.56 MHz is applied, and only a nitrogen gas is used, the silicon nitride film is characterized as described hereunder. That is, in infrared adsorption spectra thereof, adsorption peaks of an N—H connection and an Si—H connection are not observed, nor is an adsorption peak of an Si—O connection is not observed. In addition, the oxygen concentration and the hydrogen concentration in the film are not higher than 1 atom %. Also from the above, it can be known that entrance of impurity such as oxygen and moisture can be prevented even more efficiently.

In this manner, the light-emitting device having the structure as shown in FIG. 18B is completed. Note that, it is effective that the steps up to the formation of the protection film 5114 after the formation of the bank 5111 are not exposed to the atmosphere, but are continually processed.

In this embodiment, while the shielding film is formed between the third interlayer insulation film 5102 and the bank 5111, the present invention is not limited thereto. It is essential that the shielding film be provided in a position where outside light reflected in the wirings 5104 to 5110 is prevented from being visible to a viewer. For example, as in this embodiment, in the configuration where light emitted from the light-emitting element is directed to the substrate, the shielding film may be provided between the first interlayer insulation film and the second interlayer insulation film 5101. Also in this case, the shielding film includes an opening to enable the light form the light-emitting element to pass.

In addition, as described in Embodiment 7, the provision of the impurity region overlapping the gate electrode via the insulation film enables the formation of the n-channel TFT that has high resistance against deterioration occurring due to hot carrier effects. Accordingly, the light emitting device having high reliability can be implemented.

In this embodiment, only the configurations of the pixel portion and the driver circuit have been described. However, according to the manufacturing steps of this embodiment, other logic circuits, such as a signal dividing circuit, a D/A converter, an operational amplifier, and γ compensation circuit, can be formed on the same insulation material. Further, a memory, a microprocessor, and the like can also be formed.

The light emitting device manufactured as described above can be such that laser light of which energy distributions are periodic and uniform is irradiated, that includes TFTs manufactured using semiconductor layers in which large-size crystal grains are formed, and that exhibits sufficient performance characteristics and reliability. Illuminators of the type described above can be used as display portions of various electronic devices.

According to this embodiment, light emitted from the light-emitting element is directed to the TFT. However, the light may be directed to the side opposing the TFT. In this case, a resin mixed with a black dye, carbon, or black pigment may be used for the bank 5111. In this case, a material having high reflectance is used for the pixel electrode 5103, and a transparent conductive film is used for the pixel electrode 5113.

This embodiment may be implemented in combination with any one of Embodiments 1 to 6.

According to the present invention, TFTs using one or a plurality of second semiconductor islands formed of one first semiconductor island as active layers can be formed with higher homogeneity in the characteristics than in ordinary case. Hence, a circuit such as a current mirror circuit, a differential amplifier circuit, or an operational amplifier for which inter-element consistency is required can be formed on a substrate by using the TFTs. Consequently, circuits that have conventionally been mounted using external ICs or the like can synchronously be formed on a substrate including a pixel portion. This contributes to reductions in the manufacturing cost, device weight, and device size.

What is claimed is:

1. A manufacturing method for a semiconductor device comprising:

forming an amorphous semiconductor layer on a substrate;

patterning the amorphous semiconductor layer into a desired shape to form first semiconductor islands and markers;

irradiating laser light converged into an elliptical or a rectangular shape to a region including the first semiconductor islands while performing scanning relatively to the substrate to crystallize the first semiconductor islands;

patterning the crystallized first semiconductor islands into desired shapes, and forming second semiconductor islands, and forming thin-film transistors using the second semiconductor islands as active layers and configuring a circuit by using the thin-film transistors, wherein active layers of all of thin-film transistors included in a unitary circuit included in the semiconductor device are formed of any one of the crystallized first semiconductor islands.

2. A method according to claim 1, all the thin-film transistors are disposed so that charge movement directions in channel formation regions thereof are consistently arranged approximately parallel.

3. A method according to claim 1, wherein the unitary circuit is any one of a current source, a current mirror circuit, a differential amplifier circuit, and an operational amplifier circuit.

4. A method according to claim 1, wherein the laser light is oscillated from any one of a continuous-wave solid laser, a gas laser, and a metal laser.

5. A method according to claim 1, wherein the laser light is oscillated from one laser selected from the group consisting of a continuous-wave YAG laser, $YVO_4$ laser, YLF laser, $YAlO_3$ laser, glass laser, ruby laser, alexandrite laser, and Ti:sapphire laser.

6. A method according to claim 1, wherein the laser light is oscillated from one laser selected from the group consisting of a continuous-wave excimer laser Ar laser, Kr laser, and $CO_2$ laser.

7. A method according to claim 1, wherein the laser light is oscillated from one laser selected from the group consisting of a continuous-wave helium-cadmium laser, copper vapor laser, and gold vapor laser.

8. A manufacturing method for a semiconductor device, comprising:

forming an amorphous semiconductor layer on a substrate;

forming a metal-containing layer on the amorphous semiconductor layer, and obtaining a first crystalline semiconductor layer by heat treatment;

patterning the first crystalline semiconductor layer into a desired shape to form first semiconductor islands and markers;

irradiating laser light converged into an elliptical or a rectangular shape onto a region including the first semiconductor islands while performing scanning relatively to the substrate to obtain the first semiconductor islands constituted of second crystalline semiconductor layers;

patterning the first semiconductor islands constituted of the second crystalline semiconductor layers into desired shapes to form second semiconductor islands; and forming thin-film transistors using the second semiconductor islands as active layers, and configuring a circuit by using the thin-film transistors, wherein the second semiconductor islands serving as active layers of all of thin-film transistors included in a unitary circuit included in the semiconductor device are formed of any one of the first semiconductor islands constituted of the second crystalline semiconductor layers.

9. A method according to claim 8, all the thin-film transistors are disposed so that charge movement directions in channel formation regions thereof are consistently arranged approximately parallel.

10. A method according to claim 8, wherein the unitary circuit is any one of a current source, a current mirror circuit, a differential amplifier circuit, and an operational amplifier circuit.

11. A method according to claim 8, wherein the laser light is oscillated from any one of a continuous-wave solid laser, a gas laser, and a metal laser.

12. A method according to claim 8, wherein the laser light is oscillated from one laser selected from the group consisting of a continuous-wave YAG laser, $YVO_4$ laser, YLF laser, $YAlO_3$ laser, glass laser, ruby laser, alexandrite laser, and Ti:sapphire laser.

13. A method according to claim 8, wherein the laser light is oscillated from one laser selected from the group consisting of a continuous-wave excimer laser, Ar laser, Kr laser, and $CO_2$ laser.

14. A method according to claim 8, wherein the laser light is oscillated from one laser selected from the group consisting of a continuous-wave helium-cadmium laser, copper vapor laser, and gold vapor laser.

* * * * *